(12) United States Patent
Choi et al.

(10) Patent No.: US 12,029,079 B2
(45) Date of Patent: Jul. 2, 2024

(54) DISPLAY DEVICE

(71) Applicant: SAMSUNG DISPLAY CO., LTD., Yongin-si (KR)

(72) Inventors: Jonghyun Choi, Yongin-si (KR); Seunghwan Cho, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 482 days.

(21) Appl. No.: 17/466,317

(22) Filed: Sep. 3, 2021

(65) Prior Publication Data

US 2022/0208924 A1 Jun. 30, 2022

(30) Foreign Application Priority Data

Dec. 30, 2020 (KR) .................. 10-2020-0188072

(51) Int. Cl.
*H01L 27/14* (2006.01)
*H10K 59/121* (2023.01)
(Continued)

(52) U.S. Cl.
CPC ....... *H10K 59/126* (2023.02); *H10K 59/1213* (2023.02); *H10K 59/131* (2023.02); *G06F 3/044* (2013.01); *G09G 3/3233* (2013.01); *G09G 2300/0426* (2013.01); *G09G 2300/0842* (2013.01); *H01L 27/1225* (2013.01); *H01L 27/124* (2013.01); *H01L 27/1251* (2013.01); *H01L 29/78633* (2013.01); *H01L 29/78675* (2013.01); *H01L 29/7869* (2013.01)

(58) Field of Classification Search
CPC ............. H10K 59/126; H10K 59/1213; H10K 59/131; H10K 59/12; G06F 3/044; G09G 3/3233; G09G 2300/0426; G09G 2300/0842; H01L 27/1225; H01L 27/124; H01L 27/1251; H01L 29/78633; H01L 29/78675; H01L 29/7869; H01L 27/1255
USPC ..................................... 257/59, 72
See application file for complete search history.

(56) References Cited

U.S. PATENT DOCUMENTS 10,340,320 B2 7/2019 Lee et al.
2019/0278145 A1 9/2019 Tanaka et al.
(Continued)

FOREIGN PATENT DOCUMENTS

KR 1020180071538 A 6/2018
KR 1020190115135 A 10/2019
(Continued)

*Primary Examiner* — Tan N Tran
(74) *Attorney, Agent, or Firm* — CANTOR COLBURN LLP

(57) ABSTRACT

A display device includes a display area and a peripheral area outside the display area, and includes: a substrate; a first semiconductor layer located in the display area and arranged on the substrate; a second semiconductor layer arranged on the first semiconductor layer; a data line located in the display area and extending in a first direction; an input line located in the peripheral area; a connection line located in the display area and electrically connecting the data line and the input line to each other; and a shielding layer located in the display area and located between the first semiconductor layer and the connection line in a cross-section view. The shielding layer overlaps at least a portion of the connection line in a plan view.

18 Claims, 19 Drawing Sheets

(51) Int. Cl.
*H10K 59/126* (2023.01)
*H10K 59/131* (2023.01)
*G06F 3/044* (2006.01)
*G09G 3/3233* (2016.01)
*H01L 27/12* (2006.01)
*H01L 29/786* (2006.01)

(56) References Cited

U.S. PATENT DOCUMENTS

2019/0305065 A1* 10/2019 Kim .................... H01L 27/1255
2020/0083309 A1   3/2020 Wang et al.

FOREIGN PATENT DOCUMENTS

KR    1020200029103 A    3/2020
KR    1020200080890 A    7/2020

* cited by examiner ically connected to the horizontal connection line through a first contact hole defined in the organic insulating layer and extending in a second direction crossing
DISPLAY DEVICE This application claims priority to Korean Patent Application No. 10-2020-0188072, filed on Dec. 30, 2020, and all the benefits accruing therefrom under 35 U.S.C. § 119, the content of which in its entirety is herein incorporated by reference.

BACKGROUND

1. Field

One or more embodiments relate to a display device.

2. Description of the Related Art

A display device visually displays data. Such a display device includes a display area and a peripheral area. In the display area, a scan line and a data line are formed to be insulated from each other, and a pixel circuit including a thin-film transistor and a storage capacitor is provided. In addition, a light-emitting device is located in the display area. The light-emitting device driven by the pixel circuit emits light through a pixel. Various wiring lines, a scan driver, a data driver, a controller, and the like for transmitting electrical signals to the pixel circuit of the display area may be provided in the peripheral area.

Usages of the display device have increased, and various design attempts for improving the quality of the display device have been tried. In particular, various display devices having excellent characteristics such as thinning, lightening, and low power consumption have been developed. In addition, dead spaces of the display device have been reduced, and the areas of the display area of the display device have been expanding. Accordingly, in order to implement the display device having excellent characteristics and display quality and having a reduced dead space, the design of pixel circuits has been diversified.

SUMMARY

One or more embodiments include a display device having a reduced dead space and having excellent characteristics such as low power consumption and excellent display quality. However, the one or more embodiments are only examples, and the scope of the disclosure according to the invention is not limited thereby.

Additional aspects will be set forth in part in the description which follows and, in part, will be apparent from the description, or may be learned by practice of the presented embodiments of the disclosure.

According to one or more embodiments, a display device including a display area and a peripheral area outside the display area includes: a substrate; a first semiconductor layer located in the display area and arranged on the substrate; a second semiconductor layer arranged on the first semiconductor layer; a data line located in the display area and extending in a first direction; an input line located in the peripheral area; a connection line located in the display area and electrically connecting the data line and the input line to each other; and a shielding layer located in the display area and located between the first semiconductor layer and the connection line in a cross-section view, where the shielding layer overlaps at least a portion of the connection line in a plan view.

The connection line may not overlap the second semiconductor layer in the plan view. The connection line may include: a vertical connection line extending in the first direction; and a horizontal connection line extending in a second direction and arranged in a different layer from the vertical connection line, where the second direction may cross the first direction.

The horizontal connection line of the connection line may be spaced farther from the second semiconductor layer than the first semiconductor layer in the plan view.

The vertical connection line may include the same material as the data line.

The shielding layer may include: a first portion extending in the second direction to overlap at least a portion of the horizontal connection line of the connection line in the plan view; and a second portion extending in the first direction to overlap at least a portion of the vertical connection line of the connection line in the plan view.

The shielding layer may not overlap the second semiconductor layer in the plan view.

The display device may further include: a first gate electrode, at least a portion of which overlaps the first semiconductor layer in the plan view; and a second gate electrode, at least a portion of which overlaps the second semiconductor layer in the plan view.

The shielding layer may include the same material as the second gate electrode.

The first semiconductor layer and the second semiconductor layer may include different materials from each other.

The first semiconductor layer may include a silicon semiconductor material, and the second semiconductor layer may include an oxide semiconductor material.

The shielding layer may include the same material as the second semiconductor layer.

The display device may further include a driving voltage line arranged on the substrate and extending in the first direction, and the shielding layer may be electrically connected to the driving voltage line.

The display device may further include: a first gate electrode, at least a portion of which overlaps the first semiconductor layer in the plan view; a second gate electrode, at least a portion of which overlaps the second semiconductor layer in the plan view; and a node connection line electrically connecting the first gate electrode to the second semiconductor layer. The connection line may include a vertical connection line extending in the first direction, and a horizontal connection line extending in a second direction crossing the first direction, and the node connection line may not overlap the horizontal connection line of the connection line in the plan view.

The node connection line and the horizontal connection line of the connection line may include the same material as each other.

According to one or more embodiments, a display device includes: a substrate; a first semiconductor layer arranged on the substrate; a first gate electrode arranged on the first semiconductor layer and overlapping at least a portion of the first semiconductor layer in a plan view; a second semiconductor layer arranged on the first gate electrode and including a material different from a material of the first semiconductor layer; a second gate electrode arranged on the second semiconductor layer and overlapping at least a portion of the second semiconductor layer in the plan view, a horizontal connection line arranged on the second gate electrode and extending in a first direction; an organic insulating layer covering the horizontal connection line; a vertical connection line electrically connected to the horizontal connection line through a first contact hole defined in the organic insulating layer and extending in a second direction crossing the first direction; and a shielding layer between the first semiconductor layer and the horizontal connection line in a cross section view and overlapping at least a portion of the horizontal connection line and at least a portion of the vertical connection line in the plan view.

The horizontal connection line may be spaced farther from the second semiconductor layer than the first semiconductor layer in the plan view.

The shielding layer may be arranged in the same layer as the second gate electrode and include the same material as the second gate electrode.

The shielding layer may be arranged in the same layer as the second semiconductor layer and include the same material as the second semiconductor layer.

The first semiconductor layer may include a silicon semiconductor material, and the second semiconductor layer may include an oxide semiconductor material.

The display device may further include a data line and a driving voltage line each extending in the second direction and arranged in the same layer as the vertical connection line, and at least a portion of the driving voltage line may be electrically connected to the shielding layer through a second contact hole defined in the organic insulating layer.

These and/or other aspects will become apparent and more readily appreciated from the following description of the embodiments, the accompanying drawings, and claims.

These general and specific aspects may be implemented using a system, a method, a computer program, or a combination of a system, a method, and a computer program.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
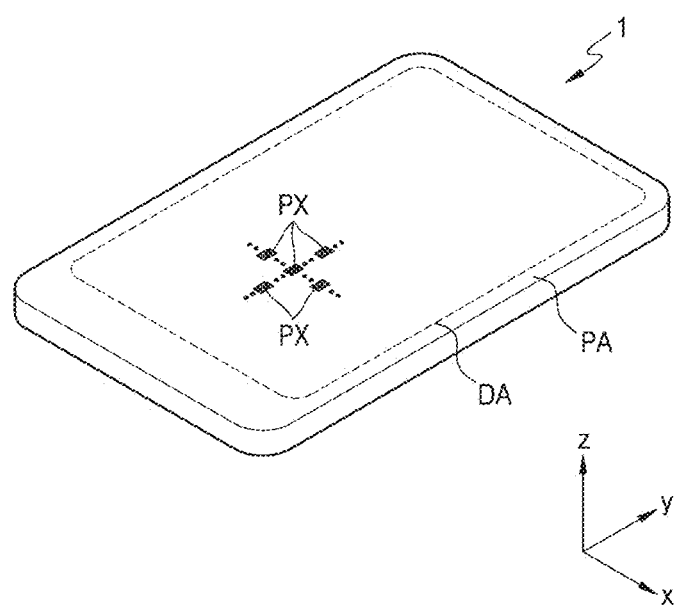
FIG. 1 is a schematic perspective view of a display device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Because the disclosure may have diverse modified embodiments, preferred embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as limited to the embodiments set forth herein.

One or more embodiments of the disclosure will be described below in more detail with reference to the accompanying drawings. Those components that are the same or are in correspondence with each other are rendered the same reference numeral regardless of the figure number, and redundant explanations are omitted.

While such terms as "first," "second," etc., may be used to describe various components, such components are not be limited to the above terms. The above terms are used only to distinguish one component from another.

An expression used in the singular encompasses the expression of the plural, unless it has a clearly different meaning in the context.

In the present specification, it is to be understood that the terms "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when a layer, region, or component is referred to as being "formed on" or "on" another layer, region, or component, it may be directly or indirectly formed on the other layer, region, or component. That is, for example, intervening layers, regions, or components may be present.

Sizes of elements in the drawings may be exaggerated for convenience of explanation. In other words, because sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." In the specification, the phrase "A and/or B" denotes A, B, or A and B. In addition, the phrase "at least one of A and B" denotes A, B, or A and B.

In the embodiments below, when layers, areas, or elements or the like are referred to as being "connected," it will be understood that they may be directly connected or an intervening portion may be present between layers, areas or elements. For example, when layers, areas, or elements or the like are referred to as being "electrically connected," they may be directly electrically connected, or layers, areas or elements may be indirectly electrically connected and an intervening portion may be present.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a schematic perspective view of a display device 1 according to an embodiment.

Referring to FIG. 1, the display device 1 may include a display area DA and a peripheral area PA located outside the display area DA. The display device 1 may provide an image through an array of a plurality of pixels PX that are two-dimensionally arranged in rows and columns in the display area DA. Each of the pixels PX may be defined as an emission area in which a light-emitting element driven by a pixel circuit emits light. That is, an image may be provided by light emitted by the light-emitting element through the pixel PX. An area in which the image is provided is determined by the arrangement of the plurality of light-emitting elements, and the display area DA may be defined by the plurality of light-emitting elements.

The display area DA may have various shapes in a plan view, such as a circle, an oval, a polygon, an irregular shape, and a shape of a specific figure. For example, FIG. 1 illustrates that the display area DA has a substantially rectangular shape having round corners. However, the disclosure according to the invention is not limited thereto.

The peripheral area PA does not provide an image, and may entirely or partially surround the display area DA. Various wiring lines, drivers, etc. for providing electric signals or power to the display area DA may be arranged in the peripheral area PA.

Hereinafter, it will be described that the display device 1 includes an organic light-emitting diode ("OLED") as a light-emitting element. However, the display device 1 according to the invention is not limited thereto. As another embodiment, the display device 1 may include a light-emitting display including an inorganic light-emitting diode, that is, an inorganic light-emitting display. As another embodiment, the display device 1 may include a quantum dot light-emitting display.

The display device 1 may be used as a display screen for various products such as televisions, notebook computers, monitors, billboards, and Internet of things ("IOTs"), devices as well as portable electronic devices such as mobile phones, smartphones, tablet personal computers ("PCs"), mobile communication terminals, electronic notebooks, e-books, portable multimedia players ("PMPs"), navigation systems, and ultra mobile PCs. In addition, the display device 1 according to the embodiment may be applied to a wearable device such as a smart watch, a watch phone, a glasses-type display, and a head mounted display ("HMD"). In addition, the display device 1 according to the embodiment may be used as an instrument panel of a vehicle, a center information display ("CID") arranged on a center fascia or dashboard of a vehicle, a room mirror display replacing a side mirror of a vehicle, and a display screen on the back of the front seat as entertainment for the rear seat of a vehicle.

Figure 2:
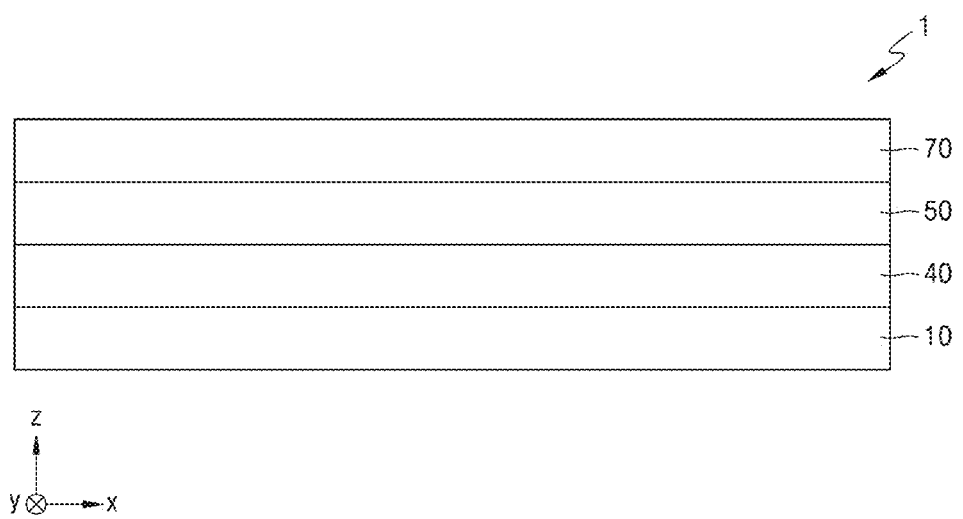
FIG. 2 is a schematic cross-sectional view of a display device according to an embodiment.

FIG. 2 is a schematic cross-sectional view of a display device 1 according to an embodiment.

Referring to FIG. 2, the display device 1 may include a display panel 10, an input sensing layer 40 arranged on the display panel 10, and an optical functional layer 50 arranged on the input sensing layer 40, and these components of the display device 1 may be covered with a cover window 70.

The display panel 10 may include a plurality of light-emitting elements and a plurality of pixel circuits electrically connected to the plurality of light-emitting elements, respectively, and may provide an image through light emitted from the light-emitting elements.

The input sensing layer 40 may acquire coordinate information according to an external input, for example, a touch event. The input sensing layer 40 may include sensing electrodes or touch electrodes and trace lines electrically connected to the sensing electrodes or touch electrodes. The input sensing layer 40 may be arranged on the display panel 10. The input sensing layer 40 may detect an external input by using a mutual capacitive method or a self-capacitive method.

The input sensing layer 40 may be directly disposed on the display panel 10. Alternatively, the input sensing layer 40 may be separately formed and then adhere to the display panel 10 through an adhesive member (not shown). As the adhesive member, a general one known in the art may be employed without limitation. The adhesive member may include an optical clear adhesive ("OCA"). As an embodiment, as shown in FIG. 2, the input sensing layer 40 may be disposed directly on the display panel 10, and in this case, the adhesive member may not be between the input sensing layer 40 and the display panel 10.

The optical functional layer 50 may include an antireflection layer. The antireflection layer may reduce the reflectance of light (external light) incident from the outside toward the display panel 10 through the cover window 70. The antireflection layer may include a retarder and a polarizer. The retarder may be of a film type or a liquid crystal coating type, and may include a $\lambda/2$ retarder and/or a $\lambda/4$ retarder. The polarizer may also be of a film type or a liquid crystal coating type. The film type may include a stretched synthetic resin film, and the liquid crystal coating type may include liquid crystals arranged in a certain arrangement. The retarder and the polarizer may each further include a protective film.

In another embodiment, the antireflection layer may include a structure of a black matrix and color filters. The color filters may be arranged considering the color of light emitted from each of the pixels PX of the display panel 10. In another embodiment, the antireflection layer may include a destructive interference structure. The destructive interference structure may include a first reflective layer and a second reflective layer arranged on different layers. First reflected light and second reflected light reflected by the first reflective layer and the second reflective layer, respectively, may destructively interfere, and thus, the reflectance of external light may be reduced.

The optical functional layer 50 may include a lens layer. The lens layer may improve the light emission efficiency of light emitted from the display panel 10 or reduce color deviation. The lens layer may include a layer having a concave or convex lens shape, or/and a plurality of layers having different refractive indices. The optical functional layer 50 may include both of the antireflection layer and the lens layer described above, or may include any one of them.

An adhesive member (not shown) may be arranged between the input sensing layer 40 and the optical functional layer 50. As the adhesive member, a general one known in the art may be employed without limitation. The adhesive member may include an optically transparent adhesive ("OCA").

The cover window 70 may have a high transmittance to transmit light emitted from the display panel 10 and may have a small thickness to reduce the weight of the display device 1. In addition, the cover window 70 may have strong strength and hardness to protect the display panel 10 from external impact, and may have impact resistance and scratch resistance.

An adhesive layer (not shown) may be arranged between the input sensing layer and the optical functional layer 50 and between the optical functional layer 50 and the cover window 70. The cover window 70 may be coupled to a component thereunder, for example, the optical functional layer 50, through an adhesive layer. In an embodiment, the adhesive layer may include OCA.

Figure 3:
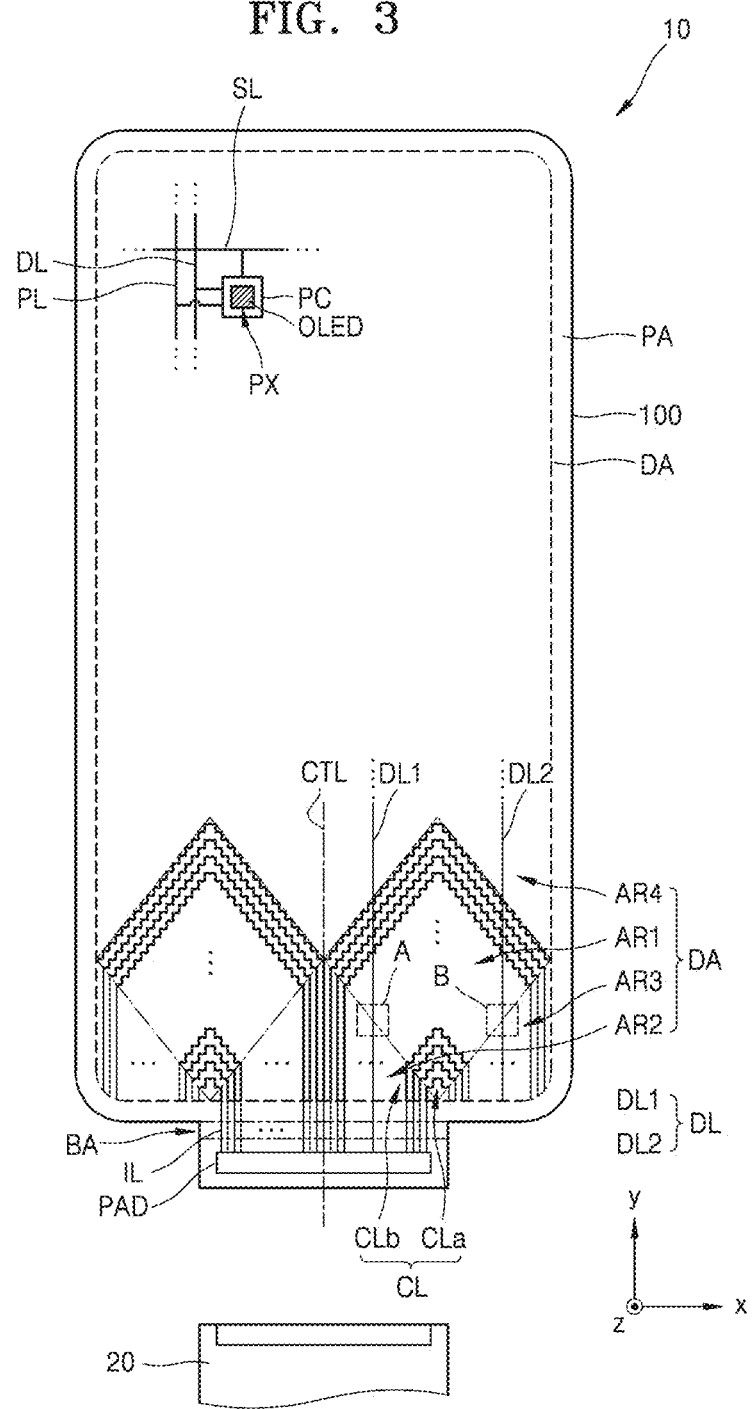
FIG. 3 is a schematic plan view of a partial configuration of a display panel of a display device according to an embodiment.

FIG. 3 is a schematic plan view of a partial configuration of a display panel 10 of a display device according to an embodiment.

Referring to FIG. 3, the display device (e.g., the display device 1 of FIG. 1) may include the display panel 10, and the display panel 10 may include a display area DA and a peripheral area PA located outside the display area DA. The display area DA and the peripheral area PA of the display panel 10 may correspond to the display area DA and the peripheral area PA of the display device 1 described above with reference to FIG. 1, respectively.

The display panel 10 may include a substrate 100. The substrate 100 may include various materials such as glass, metal, or plastic. According to an embodiment, the substrate 100 may include a flexible material. Here, the flexible material refers to a substrate that may be warped, bendable, and foldable or rollable well. The substrate 100 including the flexible material may include ultra-thin glass, metal, or plastic.

Various components included in the display panel 10 may be arranged on the substrate 100. For example, a light-emitting element such as an organic light-emitting diode OLED and a pixel circuit PC driving the organic light-emitting diode OLED may be arranged in the display area DA. As described above, an emission area through which the organic light-emitting diode OLED emits light may be defined as a pixel PX. A plurality of pixels PX may be arranged in the display area DA. The plurality of pixels PX may be arranged in various forms such as a stripe arrangement and a pentile arrangement to implement an image.

In addition, various wiring lines that provide electrical signals or power to the pixel circuit PC may be arranged in the display area DA. For example, a plurality of data lines DL for transmitting data signals to a plurality of pixel circuits PC, a plurality of scan lines SL for transmitting scan signals to the plurality of pixel circuits PC, and a plurality of driving voltage lines PL for transmitting a driving power voltage ELVDD (see FIG. 6) to the plurality of pixel circuits PC may be arranged. The plurality of data lines DL, the plurality of scan lines SL, and the plurality of driving voltage lines PL may be electrically connected to the plurality of pixel circuits PC, respectively. The data lines DL and the driving voltage lines PL may extend in a first direction (e.g., +y direction), and the scan lines SL may extend in a second direction (e.g., +x direction) crossing the first direction.

A pad portion PAD may be arranged on one side of the peripheral area PA. The pad portion PAD may be exposed without being covered by an insulating layer and be connected to a display circuit board 20. The display circuit board 20 may include a printed circuit board, a driver integrated circuit ("IC") chip, or the like. For example, the display circuit board 20 may include a data driver (not shown) that generates a data signal. The data signal generated by the data driver may be transmitted to the data line DL through the pad portion PAD. The data driver may be arranged on the display circuit board 20 by using a chip on film ("COF") method. As another example, the data driver may be directly arranged on the substrate 100 by using a chip-on-glass ("COG") or chip-on-plastic ("COP") method.

Also, in the peripheral area PA, various wiring lines transmitting electrical signals to be applied to the display area DA, and drivers may be arranged. For example, a plurality of input lines IL transmitting data signals to be applied to the display area DA may be located in the peripheral area PA. The plurality of input lines IL may be electrically connected to the pad portion PAD, and may transmit a data signal received from the pad portion PAD to the data line DL. The plurality of input lines IL may be directly or indirectly and electrically connected to the plurality of data lines DL, respectively. For example, some of the plurality of input lines IL may be directly and electrically connected to a plurality of first data lines DL1, and the rest of the plurality of input lines IL may be indirectly and electrically connected to a plurality of second data lines DL2 through a plurality of connection lines CL to be described below.

According to an embodiment of the disclosure, a plurality of connection lines CL may be arranged in the display area DA. The plurality of connection lines CL may transmit electrical signals received through the input lines IL to signal lines connected to the pixel circuits PCs. For example, each of the plurality of connection lines CL may have one end connected to an input line IL and the other end connected to a second data line DL2. That is, each of the plurality of connection lines CL may electrically connect the input line IL and the second data line DL2 to each other. Accordingly, the plurality of connection lines CL may transmit data signals supplied from the input lines IL to the plurality of second data lines DL2.

As a comparative example, because an extension length of the pad portion PAD in the +x direction is less than the width of the display area DA of the display panel 10 in the +x direction, a fan-out line for connecting the pad portion PAD to the data lines DL may be located in the peripheral area PA. In this case, dead space may increase for the arrangement of the fan-out lines.

However, in the case of an embodiment of the disclosure, because data signals are transmitted through the plurality of connection lines CL located in the display area DA without fan-out lines, the area of the peripheral area PA may be effectively reduced, and thus, the dead space of the display panel 10 may be effectively reduced.

The display panel 10 may extend in the second direction (e.g., the x direction) and may be symmetrical with respect to a virtual center line CTL passing through the center of the display panel 10. Hereinafter, for convenience of description, a plurality of connection lines CL arranged on the right side based on the virtual center line CTL will be described as an example. The following descriptions may be equally applied to a plurality of connection lines CL arranged on the left side based on the virtual center line CTL.

As an embodiment, the display area DA may be divided into several areas depending on whether the connection lines CL are arranged or not in the area. For example, the display area DA may include a first area AR1 and a second area AR2 in which the connection lines CL are arranged, and a third area AR3 and a fourth area AR4 in which the connection lines CL are not arranged.

Figure 4:
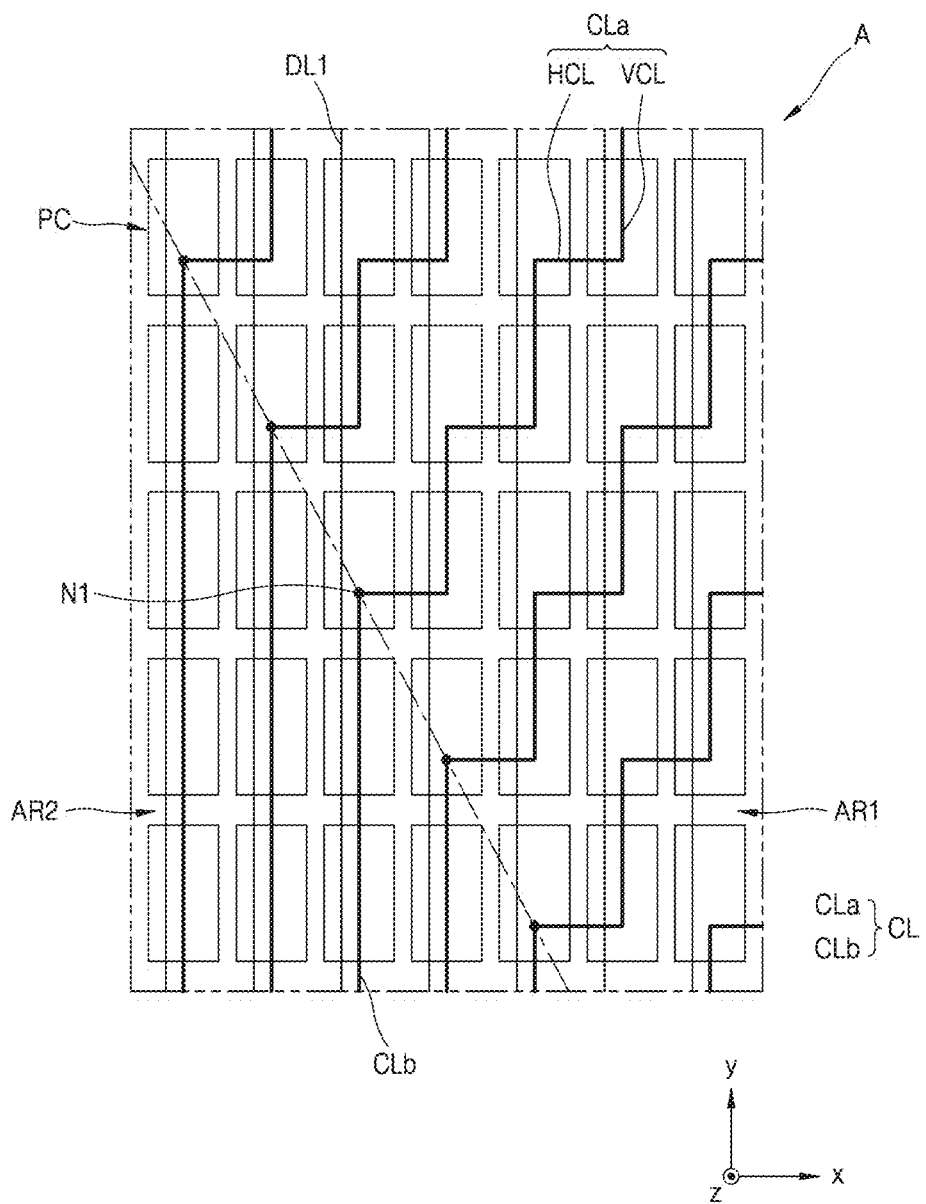
FIG. 4 is a schematic enlarged plan view of an area A of the display panel of FIG. 3.

The first area AR1 and the second area AR2 may be areas that are distinguished according to the shape of the connection lines CL. For example, each of the plurality of connection lines CL may include a first portion CLa located in the first area AR1 and a second portion CLb located in the second area AR2. As shown in FIGS. 3 and 4, the first portion CLa of each of the connection lines CL may have a shape bent at least twice, and the second portion CLb of each of the connection lines CL may have the shape of a straight line extending in one direction (e.g., y direction).

As shown in FIG. 3, the first area AR1 may have an overall quadrilateral shape (e.g., rhombus shape) in a plan view, and the second area AR2 may have an overall triangular shape in the plan view. The third area AR3 may be surrounded by the peripheral area PA and the first area AR1, and may have a triangular shape in which one vertex is round. The fourth area AR4 may also be surrounded by the peripheral area PA and the first area AR1, and may be apart from the third area AR3 by the first area AR1. However, the arrangements and shapes of the first to fourth areas AR1, AR2, AR3, and AR4 are examples, and the disclosure according to the invention is not limited thereto.

As another embodiment, dummy connection lines (not shown) may be arranged in the third area AR3 and the fourth area AR4. Each of the dummy connection lines may include the same material as the plurality of connection lines CL, and may have a pattern similar to those of the plurality of connection lines CL. However, the dummy connection lines may not be electrically connected to the input line IL and the data line DL. Accordingly, the dummy connection lines may be distinguished from the plurality of connection lines CL that substantially transmit electrical signals. However, by arranging the dummy connection lines in the third and fourth areas AR3 and AR4, the characteristics reflecting external light in the third and fourth areas AR3 and AR4 may be similar to the characteristics reflecting external light in the first and second areas AR1 and AR2, and thus, visibility deviation occurring between the third and fourth areas AR3 and AR4 and the first and second areas AR1 and AR2 may be improved (i.e., reduced).

FIG. 3 illustrates the appearance of the substrate 100 of the display panel 10 during a process of manufacturing the display device 1. In an electronic device such as the display device 1 or a smartphone including the display device 1, a portion of the substrate 100 of the display panel 10 may be bent in order to reduce the area of the peripheral area PA recognized by a user.

As shown in FIG. 3, the peripheral area PA may include a bending area BA, and the bending area BA may be located between the pad portion PAD and the display area DA. The substrate 100 may be bent in the bending area BA so that at least a portion of the pad portion PAD is located to overlap the display area DA in the plan view. A bending direction is set such that the pad portion PAD does not cover the front surface of the display area DA and is located on the rear surface of the display area DA. Accordingly, a user recognizes that the display area DA occupies most of the display device 1.

Figure 5:
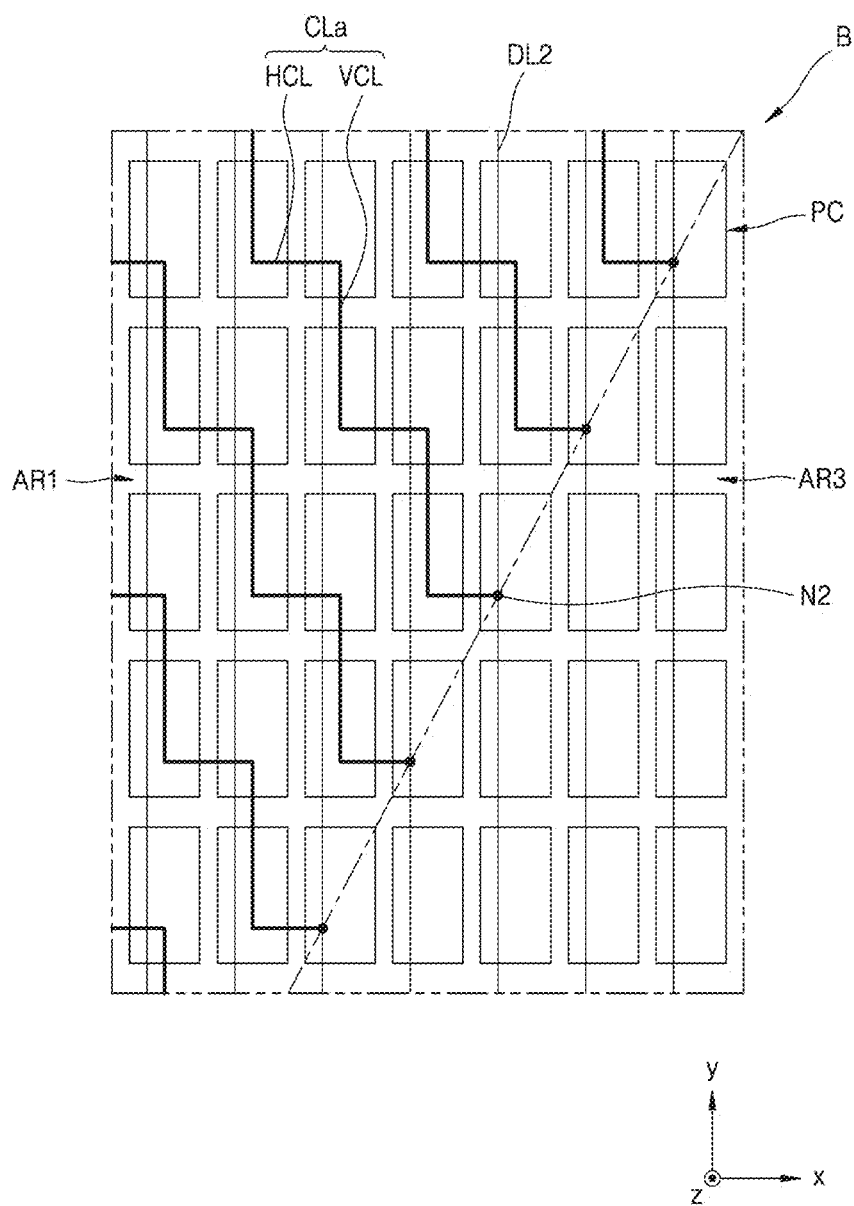
FIG. 5 is a schematic enlarged plan view of an area B of the display panel of FIG. 3.

FIG. 4 is a schematic enlarged plan view of an area A of the display panel 10 of FIG. 3, and FIG. 5 is a schematic enlarged plan view of an area B of the display panel 10 of FIG. 3.

Referring to FIG. 4, the pixel circuit PC may be repeatedly arranged in rows and columns.

In an embodiment, the first portion CLa of each of the plurality of connection lines CL may have a shape bent at least twice in a plan view. In an embodiment, the first portion CLa may include a vertical connection line VCL extending in the first direction (e.g., the +y direction) and a horizontal connection line HCL extending in the second direction (e.g., the +x direction) crossing the first direction.

The first portion CLa of one connection line CL may be formed by alternately connecting a plurality of vertical connection lines VCL to a plurality of horizontal connection lines HCL. Accordingly, the first portion CLa of each of the plurality of connection lines CL may have a step shape as a whole in a plan view. However, the disclosure according to the invention is not limited thereto, and the planar shape of the first portion CLa may be variously modified.

In an embodiment, the vertical connection line VCL and the horizontal connection line HCL may be arranged on different layers. The vertical connection line VCL and the horizontal connection line HCL may be electrically connected to each other through a contact hole defined in an insulating layer therebetween. The vertical connection line VCL may be at least a part of the vertical connection line VCL shown in FIG. 14, the horizontal connection line HCL may be at least a part of the horizontal connection line HCL shown in FIG. 13.

The second portion CLb of each of the plurality of connection lines CL may extend in the first direction (e.g., the +y direction) and may have a straight line shape. The second portion CLb may be substantially parallel to the first data line DL1 extending in the first direction (e.g., the +y direction). The second portion CLb may be at least a part of the vertical connection line VCL shown in FIG. 14.

The first portion CLa and the second portion CLb of one connection line CL may be electrically connected to each other at a first node N1. For example, one end of the second portion CLb may be electrically connected to the horizontal connection line HCL of the first portion CLa at the first node N1. A plurality of first nodes N1 may be formed by as many as the number of connection lines CL, and a virtual line (See dot-dash lines in FIG. 4) connecting the first nodes N1 may be a boundary between the first area AR1 and the second area AR2. Although not shown, as described above, the other end of the second portion CLb may be electrically connected to the input line IL (see FIG. 3).

Referring to FIG. 5, each of the plurality of connection lines CL may be electrically connected to a corresponding one of a plurality of second data lines DL2. For example, the first portion CLa of each of the plurality of connection lines CL may be electrically connected to a second data line DL2 at a second node N2. A plurality of second nodes N2 may be formed by as many as the number of connection lines CL, and a virtual line (See dot-dash lines in FIG. 5) connecting the second nodes N2 may be a boundary between the first area AR1 and the third area AR3.

As a result, because the first portion CLa of each of the plurality of connection lines CL is connected to the second data line DL2 and the second portion CLb is connected to the input line IL, each of the plurality of connection lines CL may electrically connect the second data line DL2 and the input line IL to each other.

Figure 6:
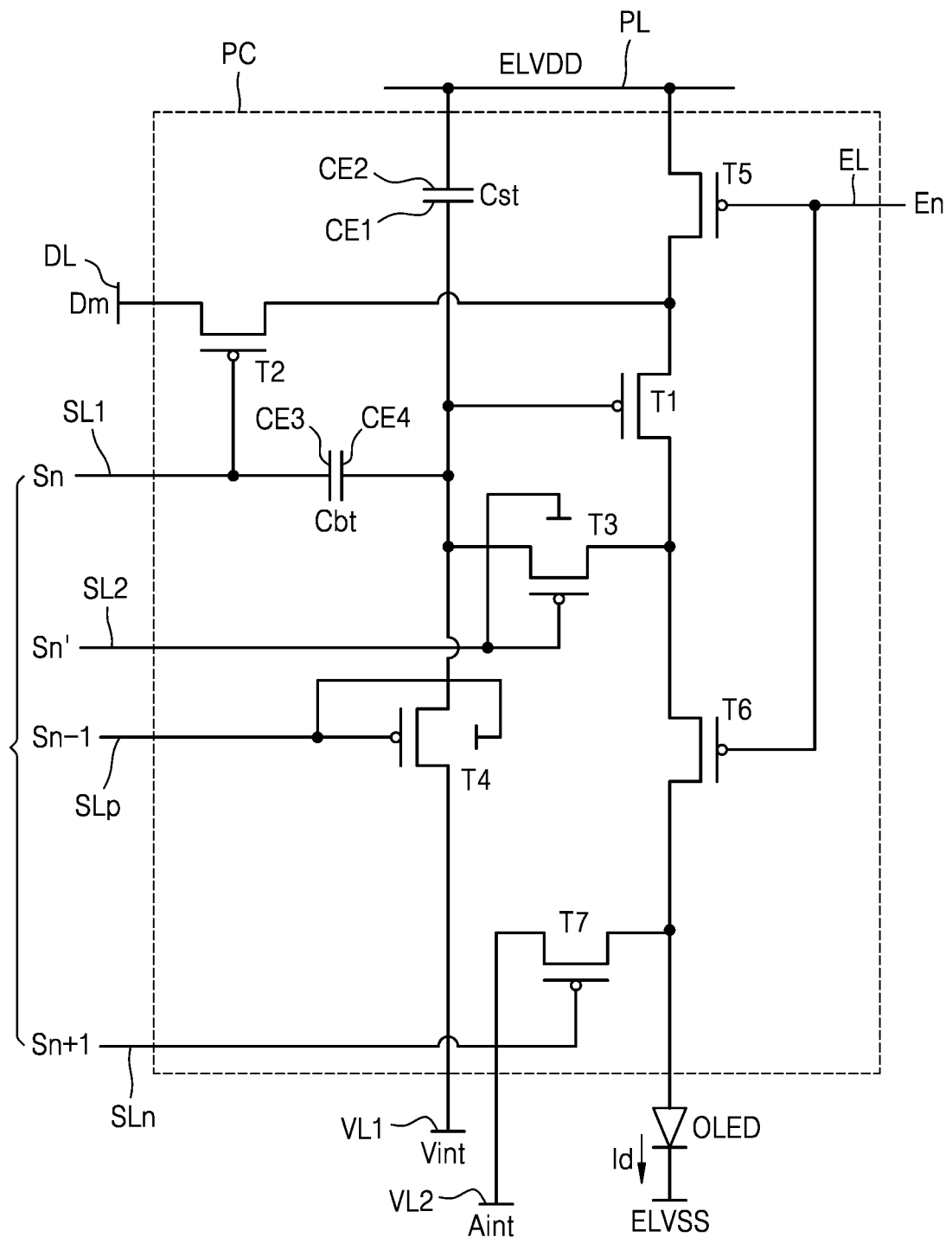
FIG. 6 is an equivalent circuit diagram of one pixel circuit included in a display device according to an embodiment.

FIG. 6 is an equivalent circuit diagram of one pixel circuit PC included in a display device 1 according to an embodiment.

Referring to FIG. 6, an organic light-emitting diode OLED may emit light by receiving a driving current Id through a pixel circuit PC.

For example, the pixel circuit PC may include a plurality of thin-film transistors T1 to T7, a storage capacitor Cst, and a boosting capacitor Cbt. The plurality of thin-film transistors T1 to T7 and the storage capacitor Cst may be connected to signal lines SL1, SL2, SLp, SLn, EL, and DL, a first initialization voltage line VL1, a second initialization voltage line (or an anode initialization voltage line) VL2, and a driving voltage line PL. In an embodiment, at least one of the above-described wiring lines, for example, the driving voltage line PL, may be shared by neighboring pixel circuits PCs.

The plurality of thin-film transistors T1 to T7 may include a driving thin-film transistor T1, a switching thin-film transistor T2, a compensation thin-film transistor T3, a first initialization thin-film transistor T4, an operation control thin-film transistor T5, an emission control thin-film transistor T6, and a second initialization thin-film transistor T7.

The organic light-emitting diode OLED may include a pixel electrode (or an anode electrode) and an opposite electrode (or a cathode electrode), the pixel electrode of the organic light-emitting diode OLED may be connected to the driving thin-film transistor T1 via the emission control thin-film transistor T6 and receive a driving current Id, and the opposite electrode may receive a common power voltage ELVSS. The organic light-emitting diode OLED may generate light having a luminance corresponding to the driving current Id.

Some of the plurality of thin-film transistors T1 to T7 may be n-channel metal oxide semiconductor field-effect ("NMOS") transistors, and the rest of the plurality of thin-film transistors T1 to T7 may be p-channel metal oxide semiconductor field-effect ("PMOS") transistors. For example, among the plurality of thin-film transistors T1 to T7, the compensation thin-film transistor T3 and the first initialization thin-film transistor T4 may be NMOS transistors, and the rest of thin-film transistors T1 to T7 may be PMOS transistors.

In another embodiment, among the plurality of thin-film transistors T1 to T7, the compensation thin-film transistor T3, the first initialization thin-film transistor T4, and the second initialization thin-film transistor T7 may be NMOS transistors, and the rest of thin-film transistors T1 to T7 may be PMOS transistors. Alternatively, only one of the plurality of thin-film transistors T1 to T7 may be an NMOS transistor and the rest of thin-film transistors T1 to T7 may be PMOS transistors. Alternatively, all of the plurality of thin-film transistors T1 to T7 may be NMOS transistors.

The signal lines may include a first scan line SL1 configured to transmit a first scan signal Sn, a second scan line SL2 configured to transmit a second scan signal Sn', a previous scan line SLp configured to transmit a previous scan signal Sn−1 to the first initialization thin-film transistor T4, an emission control line EL configured to transmit an emission control signal En to the operation control thin-film transistor T5 and the emission control thin-film transistor T6, a next scan line SLn configured to transmit a next scan signal Sn+1 to the second initialization thin-film transistor T7, and a data line DL configured to cross the first scan line SL1 and transmit a data signal Dm.

The driving voltage line PL may transmit a driving power voltage ELVDD to the driving thin-film transistor T1, and the first initialization voltage line VL1 may transmit an initialization voltage Vint for initializing the driving thin-film transistor T1.

The driving gate electrode of the driving thin-film transistor T1 may be connected to the storage capacitor Cst, and the driving source region of the driving thin-film transistor T1 may be connected to the driving voltage line PL via the operation control thin-film transistor T5. In addition, the driving drain region of the driving thin-film transistor T1 may be electrically connected to the pixel electrode of the organic light-emitting diode OLED via the emission control thin-film transistor T6. The driving thin-film transistor T1 may receive the data signal Dm according to a switching operation of the switching thin-film transistor T2 and supply the driving current Id to the organic light-emitting diode OLED.

The switching gate electrode of the switching thin-film transistor T2 may be connected to the first scan line SL1 that transmits the first scan signal Sn, and the switching source region of the switching thin-film transistor T2 may be connected to the data line DL. The switching drain region of the switching thin-film transistor T2 may be connected to the driving source region of the driving thin-film transistor T1 and may be connected to the driving voltage line PL via the operation control thin-film transistor T5. The switching thin-film transistor T2 may be turned on according to the first scan signal Sn received through the first scan line SL1 and perform a switching operation for transmitting the data signal Dm transmitted to the data line DL to the driving source region of the driving thin-film transistor T1.

The compensation gate electrode of the compensation thin-film transistor T3 may be connected to the second scan line SL2. The compensation drain region of the compensation thin-film transistor T3 may be connected to the driving drain region of the driving thin-film transistor T1 and may be connected to the pixel electrode of the organic light-emitting diode OLED via the emission control thin-film transistor T6. The compensation source region of the compensation thin-film transistor T3 may be connected to the first electrode CE1 of the storage capacitor Cst and the driving gate electrode of the driving thin-film transistor T1. In addition, the compensation source region may be connected to the first initialization drain region of the first initialization thin-film transistor T4.

The compensation thin-film transistor T3 may be turned on according to the second scan signal Sn' received through the second scan line SL2 to electrically connect the driving gate electrode and the driving drain region of the driving thin-film transistor T1 to each other, and thus, the driving thin-film transistor T1 may be diode-connected.

The first initialization gate electrode of the first initialization thin-film transistor T4 may be connected to the previous scan line SLp. The first initialization source region of the first initialization thin-film transistor T4 may be connected to the first initialization voltage line VL1. The first initialization drain region of the first initialization thin-film transistor T4 may be connected to the first electrode CE1 of the storage capacitor Cst, the compensation source region of the compensation thin-film transistor T3, and the driving gate electrode of the driving thin-film transistor T1. The first initialization thin-film transistor T4 may be turned on according to the previous scan signal Sn−1 received through the previous scan line SLp and transmit the initialization voltage Vint to the driving gate electrode of the driving thin-film transistor T1 to perform an initialization operation for initializing a voltage of the driving gate electrode of the driving thin-film transistor T1.

The operation control gate electrode of the operation control thin-film transistor T5 may be connected to the emission control line EL, the operation control source region of the operation control thin-film transistor T5 may be connected to the driving voltage line PL, and the operation control drain region of the operation control thin-film transistor T5 may be connected to the driving source region of the driving thin-film transistor T1 and the switching drain region of the switching thin-film transistor T2.

The emission control gate electrode of the emission control thin-film transistor T6 may be connected to the emission control line EL, the emission control source region of the emission control thin-film transistor T6 may be connected to the driving drain region of the driving thin-film transistor T1 and the compensation drain region of the compensation thin-film transistor T3, and the emission control drain region of the emission control thin-film transistor T6 may be connected to the second initialization drain region of the second initialization thin-film transistor T7 and the pixel electrode of the organic light-emitting diode OLED.

The operation control thin-film transistor T5 and the emission control thin-film transistor T6 may be simultaneously turned on according to the emission control signal En received through the emission control line EL, and thus, the driving power voltage ELVDD may be transmitted to the organic light-emitting diode OLED and the driving current Id may flow through the organic light-emitting diode OLED.

The second initialization gate electrode of the second initialization thin-film transistor T7 may be connected to the next scan line SLn, the second initialization drain region of the second initialization thin-film transistor T7 may be connected to the emission control drain region of the emission control thin-film transistor T6 and the pixel electrode of the organic light-emitting diode OLED, and the second initialization source region of the second initialization thin-film transistor T7 may be connected to the second initialization voltage line VL2 to receive an anode initialization voltage Aint. The second initialization thin-film transistor T7 may be turned on according to the next scan signal Sn+1 received through the next scan line SLn and initialize the pixel electrode of the organic light-emitting diode OLED.

In an embodiment, the second initialization thin-film transistor T7 may be connected to the next scan line SLn, as shown in FIG. 6. In another embodiment, the second initialization thin-film transistor T7 may be connected to the emission control line EL and driven according to the emission control signal En.

The positions of the source regions and the drain regions may be changed according to the types (p-type or n-type) of transistors.

The storage capacitor Cst may include the first electrode CE1 and a second electrode CE2. The first electrode CE1 of the storage capacitor Cst may be connected to the driving gate electrode of the driving thin-film transistor T1, and the second electrode CE2 of the storage capacitor Cst may be connected to the driving voltage line PL. The storage capacitor Cst may store charges corresponding to a voltage difference between the voltage of the driving gate electrode of the driving thin-film transistor T1 and the driving power voltage ELVDD.

A boosting capacitor Cbt may include a third electrode CE3 and a fourth electrode CE4. The fourth electrode CE4 of the boosting capacitor Cbt may be connected to the first electrode CE1 of the storage capacitor Cst, and the third electrode CE3 of the boosting capacitor Cbt may receive the first scan signal Sn. The boosting capacitor Cbt may compensate for a voltage drop of the driving gate electrode of the driving thin-film transistor T1 by increasing the voltage of the driving gate electrode of the driving thin-film transistor T1 when the provision of the first scan signal Sn is stopped.

A detailed operation of each pixel circuit PC according to an embodiment is as follows.

During an initialization period, when the previous scan signal Sn−1 is supplied through the previous scan line SLp, the first initialization thin-film transistor T4 may be turned on in response to the previous scan signal Sn−1, and the driving thin-film transistor T1 may be initialized by the initialization voltage Vint supplied from the first initialization voltage line VL1.

During a data programming period, when the first scan signal Sn and the second scan signal Sn' are supplied through the first scan line SL1 and the second scan line SL2, respectively, the switching thin-film transistor T2 and the compensation thin-film transistor T3 may be turned on in response to the first scan signal Sn and the second scan signal Sn'. In this case, the driving thin-film transistor T1 may be diode-connected by turning on the compensation thin-film transistor T3 and biased in a forward direction.

Then, a compensation voltage Dm+Vth (Vth is a negative value) obtained by decreasing the data signal Dm supplied from the data line DL by a threshold voltage ("Vth") of the driving thin-film transistor T1 may be applied to the driving gate electrode of the driving thin-film transistor T1.

The driving power voltage ELVDD and the compensation voltage Dm+Vth may be applied to opposite ends of the storage capacitor Cst, respectively, and charges corresponding to a voltage difference between the opposite ends are stored in the storage capacitor Cst.

During an emission period, the operation control thin-film transistor T5 and the emission control thin-film transistor T6 may be turned on by the emission control signal En supplied from the emission control line EL. The driving current Id may be generated according to a voltage difference between the voltage of the driving gate electrode of the driving thin-film transistor T1 and the driving power voltage ELVDD, and the driving current Id may be supplied to the organic light-emitting diode OLED through the emission control thin-film transistor T6.

According to an embodiment of the disclosure, some of the plurality of thin-film transistors T1 to T7 may include different materials from the others. For example, at least one of the plurality of thin-film transistors T1 to T7 may include a semiconductor layer including oxide, and the others may each include a semiconductor layer including silicon.

Specifically, the driving thin-film transistor T1, which directly affects the brightness of the display device, may be configured to include a semiconductor layer including polycrystalline silicon having high reliability, thereby implementing a high-resolution display device.

Because the oxide semiconductor has high carrier mobility and low leakage current, a voltage drop is not large even though a driving time is long. That is, even during low-frequency driving, a color change of an image due to the voltage drop is not large, and thus, low-frequency driving may be performed.

Because the oxide semiconductor has an advantage of having a small leakage current as described above, at least one of the compensation thin-film transistor T3 connected to the driving gate electrode of the driving thin-film transistor T1, the first initialization thin-film transistor T4, and the second initialization thin-film transistor T7 may include an oxide semiconductor to thereby prevent leakage current that may flow to the gate electrode of the driving thin-film transistor T1 and reduce power consumption.

Figure 7:
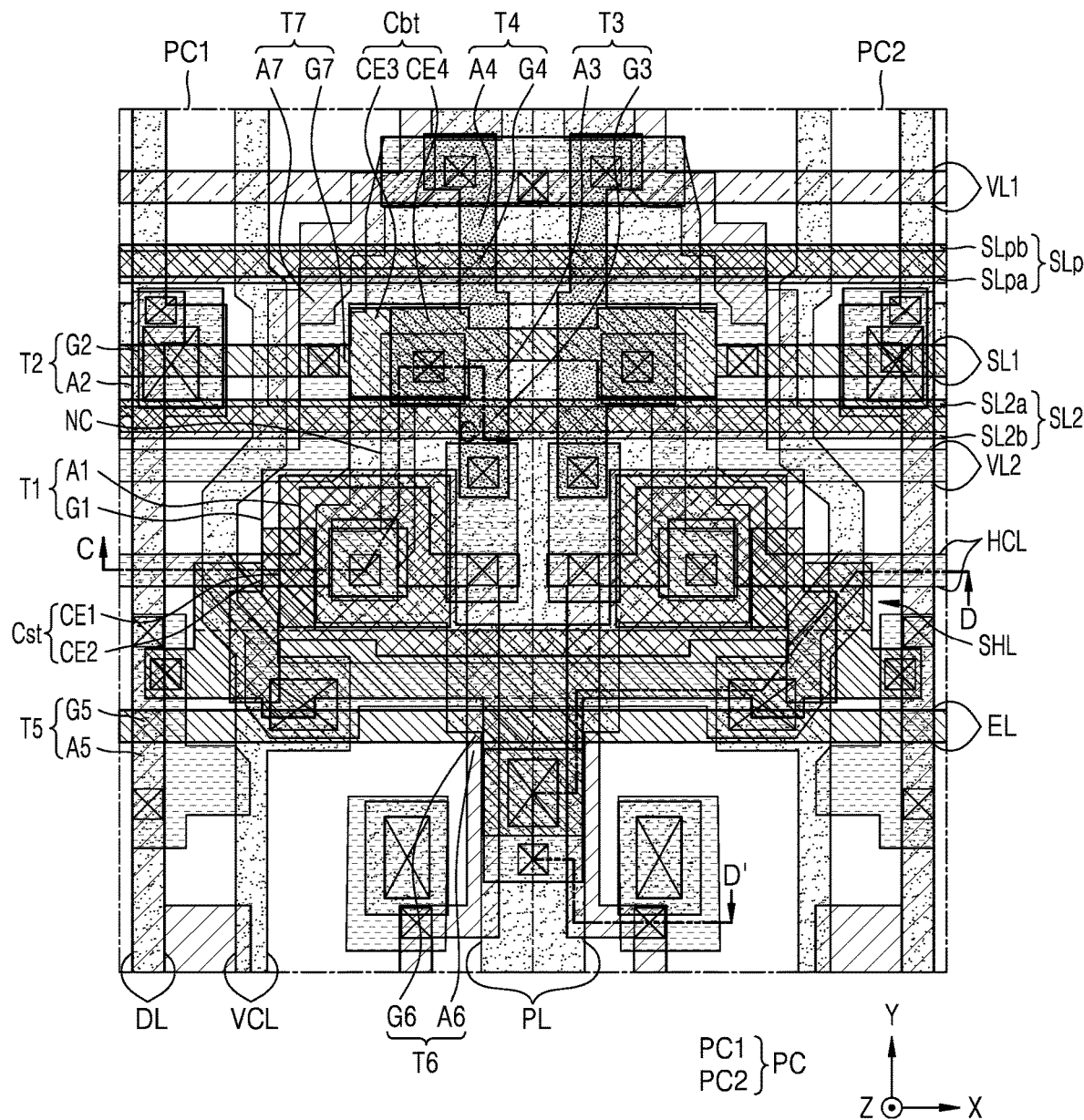
FIG. 7 is a schematic plan view illustrating a structure of a pixel circuit of a display panel according to an embodiment.

FIG. 7 is a schematic plan view illustrating a structure of a pixel circuit PC of a display panel 10 according to an embodiment, and FIGS. 8 to 14 are plan views illustrating pattern layers constituting the pixel circuit PC of FIG. 7.

Referring to FIGS. 7 to 14, the display panel 10 (see FIG. 2) of the display device 1 (see FIG. 2) may include a first pixel circuit PC1 and a second pixel circuit PC2 adjacent to each other. In an embodiment, the first pixel circuit PC1 and the second pixel circuit PC2 may have a structure symmetrical with respect to an imaginary line. In another embodiment, the first pixel circuit PC1 and the second pixel circuit PC2 may not have a symmetrical structure, but may have a structure in which the same structure is continuously repeated. Hereinafter, for convenience of description, the first pixel circuit PC1 will be described as a reference.

Referring to FIG. 7, the first pixel circuit PC1 may include a driving thin-film transistor T1, a switching thin-film transistor T2, a compensation thin-film transistor T3, a first initialization thin-film transistor T4, an operation control thin-film transistor T5, an emission control thin-film transistor T6, a second initialization thin-film transistor T7, a storage capacitor Cst, and a boost capacitor Cbt.

In addition, the first pixel circuit PC1 may include a data line DL and a driving voltage line PL, which extend in a first direction (e.g., +y direction), and may include a first scan line SL1, a second scan line SL2, a previous scan line SLp, an emission control line EL, a first initialization voltage line VL1, and a second initialization voltage line VL2, which extend in a second direction (e.g., +x direction) crossing the first direction.

Figure 13:
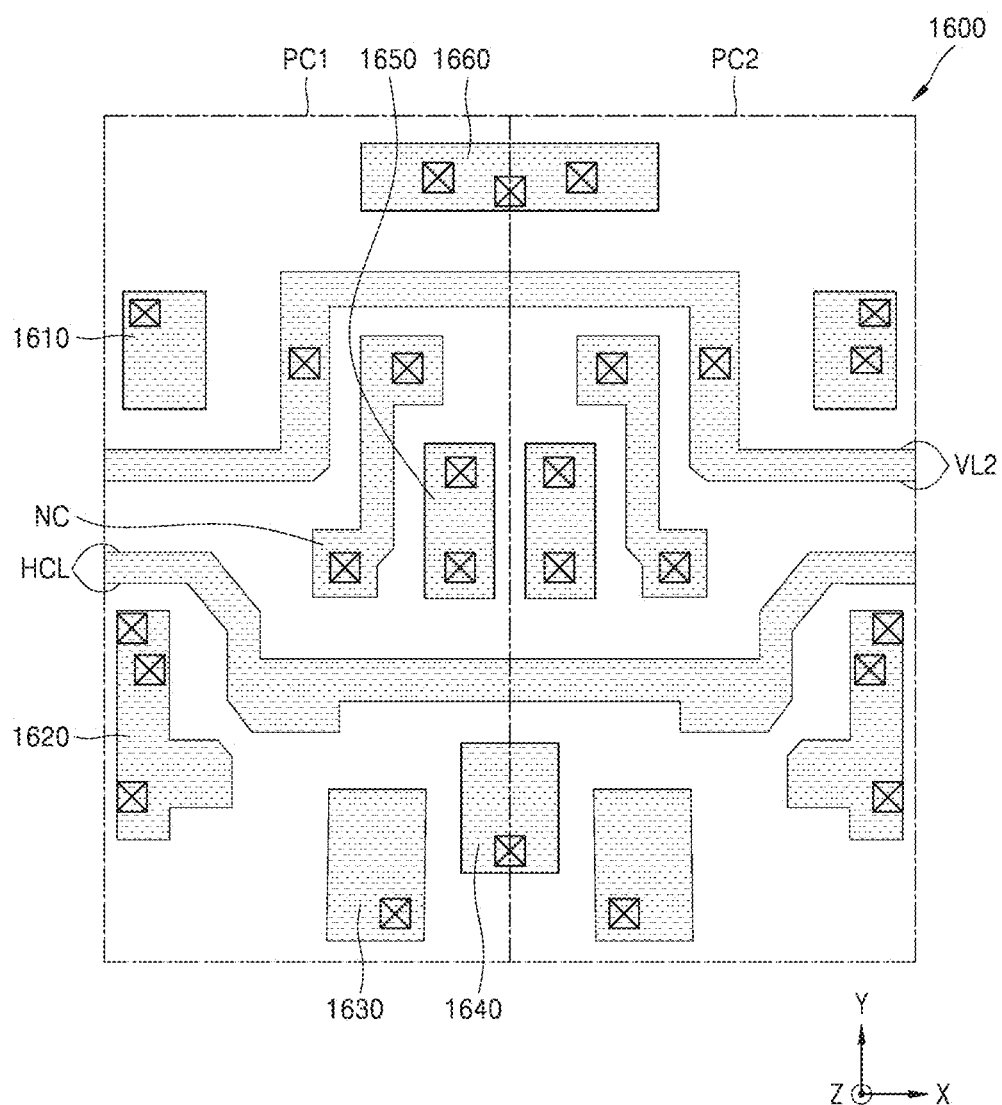
Figure 14:
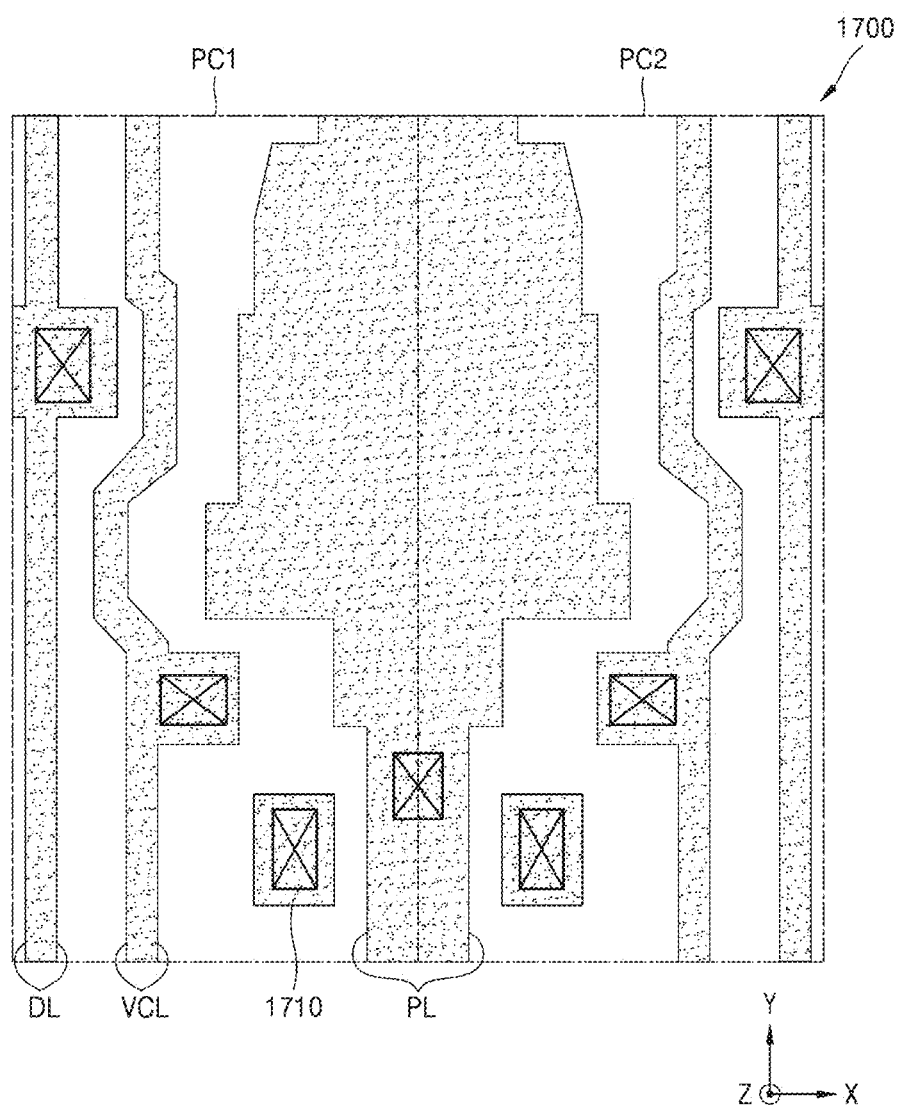

In addition, the first pixel circuit PC1 may include a shielding layer SHL, a node connection line NC, a horizontal connection line HCL, and a vertical connection line VCL, and may include first to sixth connection electrodes 1610, 1620, 1630, 1640, 1650, and 1660 (see FIG. 13) and a seventh connection electrode 1710 (see FIG. 14).

FIG. 7 illustrates pixel circuits PC1 and PC2 of a current row (or n-th row) arranged in two columns. The second scan line SL2 arranged in each of the first and second pixel circuits PC1 and PC2 may be a first scan line SL1 of a next row (or (n+1)-th row). That is, the first scan line SL1 shown in FIG. 7 may be a second scan line SL2 of a previous row (or (n−1)-th row). FIG. 7 illustrates a second initialization thin-film transistor T7 connected to a pixel circuit (not shown) of a previous row and arranged in a circuit area of a current row. Here, an area in which one pixel circuit is arranged is defined as one circuit area. Hereinafter, for convenience of illustration and description, the second initialization transistor T7 connected to a pixel circuit (not shown) of a previous row and arranged in a circuit area of a current row will be described as an example.

The driving thin-film transistor T1 may include a driving semiconductor layer A1 and a driving gate electrode G1, and the switching thin-film transistor T2 may include a switching semiconductor layer A2 and a switching gate electrode G2. The compensation thin-film transistor T3 may include a compensation semiconductor layer A3 and a compensation gate electrode G3, and the first initialization thin-film transistor T4 may include a first initialization semiconductor layer A4 and a first initialization gate electrode G4. The operation control thin-film transistor T5 may include an operation control semiconductor layer A5 and an operation control gate electrode G5, the emission control thin-film transistor T6 may include an emission control semiconductor layer A6 and an emission control gate electrode G6, and the second initialization thin-film transistor T7 may include a second initialization semiconductor layer A7 and a second initialization gate electrode G7.

In an embodiment, the driving semiconductor layer A1, the switching semiconductor layer A2, the operation control semiconductor layer A5, the emission control semiconductor layer A6, and the second initialization semiconductor layer A7 may each include a silicon semiconductor layer including a silicon semiconductor material. The compensation semiconductor layer A3 and the first initialization semiconductor layer A4 may each include an oxide semiconductor layer including an oxide semiconductor material.

In another embodiment, the driving semiconductor layer A1, the switching semiconductor layer A2, the first initialization semiconductor layer A4, the operation control semiconductor layer A5, the emission control semiconductor layer A6, and the second initialization semiconductor layer A7 may each include a silicon semiconductor layer including a silicon semiconductor material. The compensation semiconductor layer A3 may include an oxide semiconductor layer including an oxide semiconductor material.

In another embodiment, the driving semiconductor layer A1, the switching semiconductor layer A2, the compensation semiconductor layer A3, the first initialization semiconductor layer A4, the operation control semiconductor layer A5, the emission control semiconductor layer A6, and the second initialization semiconductor layer A7 may each include a silicon semiconductor layer including a silicon semiconductor material.

Hereinafter, a case in which the compensation semiconductor layer A3 of the compensation thin-film transistor T3 and the first initialization semiconductor layer A4 of the first initialization thin-film transistor T4 each include an oxide semiconductor material and the semiconductor layers A1, A2, A5, A6, and A7 of the remaining thin-film transistors T1, T2, T5, T6, and T7 each include a silicon semiconductor material will be described. However, the disclosure according to the invention is not limited thereto.

In an embodiment, some of the wiring lines may be two conductive lines arranged on different layers. For example, the second scan line SL2 may include a lower scan line SL2a and an upper scan line SL2b arranged on different layers. The lower scan line SL2a may be arranged to at least partially overlap the upper scan line SL2b in a plan view.

Also, the previous scan line SLp may include a lower scan line SLpa and an upper scan line SLpb arranged on different layers. The lower scan line SLpa may be arranged to at least partially overlap the upper scan line SLpb in a plan view.

Figure 8:
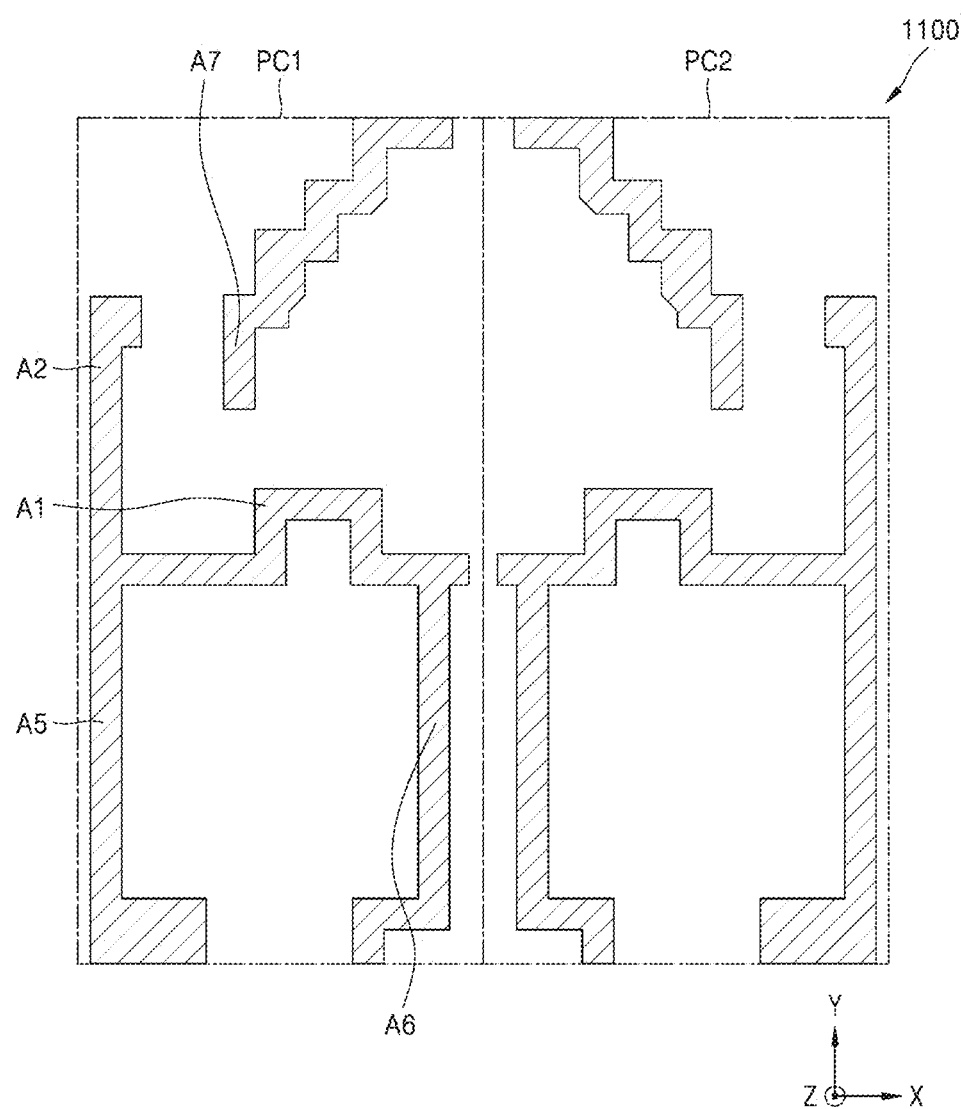
FIGS. 8 to 14 are plan views illustrating pattern layers constituting the pixel circuit of FIG. 7.

Referring to FIG. 8 in addition to FIG. 7, a first pattern layer 1100 may include a driving semiconductor layer A1, a switching semiconductor layer A2, an operation control semiconductor layer A5, an emission control semiconductor layer A6, and a second initialization semiconductor layer A7. The first pattern layer 1100 may include polycrystalline silicon or amorphous silicon. That is, the driving semiconductor layer A1, the switching semiconductor layer A2, the operation control semiconductor layer A5, the emission control semiconductor layer A6, and the second initialization semiconductor layer A7 may be arranged in the same layer and include the same material.

At least one of the driving semiconductor layer A1, the switching semiconductor layer A2, the operation control semiconductor layer A5, the emission control semiconductor layer A6, and the second initialization semiconductor layer A7 may be bent in various shapes.

The driving semiconductor layer A1, the switching semiconductor layer A2, the operation control semiconductor layer A5, the emission control semiconductor layer A6, and the second initialization semiconductor layer A7 may be connected to one another. FIG. 8 illustrates the first pattern layer 1100 included in a pixel circuit PC of an n-th row, and the second initialization semiconductor layer A7 may be connected to a first pattern layer 1100 included in a pixel circuit PC of (n−1)-th row.

Each of the driving semiconductor layer A1, the switching semiconductor layer A2, the operation control semiconductor layer A5, the emission control semiconductor layer A6, and the second initialization semiconductor layer A7 may include a source region and a drain region. For example, the source region and the drain region may be doped with impurities, and the impurities may include N-type impurities or P-type impurities. A channel region is a region overlapping a gate electrode in a plan view, which will be described later with reference to FIG. 9, and may not be doped with impurities or may include a very small amount of impurities. The source region and the drain region may correspond to a source electrode and a drain electrode of a thin-film transistor, respectively. The source region and the drain region may be changed to each other according to the characteristics of a transistor. Hereinafter, for convenience, the terms of a source region and a drain region are used instead of a source electrode and a drain electrode.

The driving semiconductor layer A1 may include a driving channel region, and a driving source region and a driving drain region on both sides of the driving channel region. One end of the driving semiconductor layer A1 may be connected to the switching semiconductor layer A2 and the operation control semiconductor layer A5, and the other end of the driving semiconductor layer A1 may be connected to the compensation semiconductor layer A3 and the emission control semiconductor layer A6.

The driving semiconductor layer A1, for example, the channel region of the driving semiconductor layer A1, may have a curved shape and thus may be longer than the other semiconductor layers A2 to A7. For example, because the driving semiconductor layer A1 has a shape such as an omega (Ω) or an alphabet "S" that is bent multiple times, a long channel length may be disposed in a narrow space. Because the driving semiconductor layer A1 is long, the driving range of a gate voltage applied to the driving gate electrode G1 (see FIG. 9) may be widened, and thus, the gradation of light emitted from the organic light-emitting diode OLED may be controlled more precisely and display quality may be improved.

The switching semiconductor layer A2 may include a switching source region and a switching drain region on both sides of a switching channel region. One of the switching source region and the switching drain region may be connected to the driving source region or the driving drain region, and the other of the switching source region and the switching drain region may be connected to a data line DL through the first connection electrode 1610 (see FIG. 13).

The operation control semiconductor layer A5 may include an operation control source region and an operation control drain region on both sides of an operation control channel region. One of the operation control source region and the operation control drain region may be connected to one of the driving source region and the driving drain region, and the other of the operation control source region and the operation control drain region may be connected to a driving voltage line PL through the second connection electrode 1620 (see FIG. 13).

The emission control semiconductor layer A6 may include an emission control source region and an emission control drain region on both sides of an emission control channel region. One of the emission control source region and the emission control drain region may be connected to one of the driving drain region and the driving source region, and the other of the emission control source region and the emission control drain region may be connected to a pixel electrode 210 (see FIG. 15) of an organic light-emitting diode OLED (see FIG. 15) through the third connection electrode 1630 (see FIG. 13) and the seventh connection electrode 1710 (see FIG. 14).

The second initialization semiconductor layer A7 may include a second initialization source region and a second initialization drain region on both sides of a second initialization channel region. One of the second initialization source region and the second initialization drain region may be connected to the emission control semiconductor layer A6. The other of the second initialization source region and the second initialization drain region may be connected to a second initialization voltage line VL2 through a contact hole.

Figure 9:
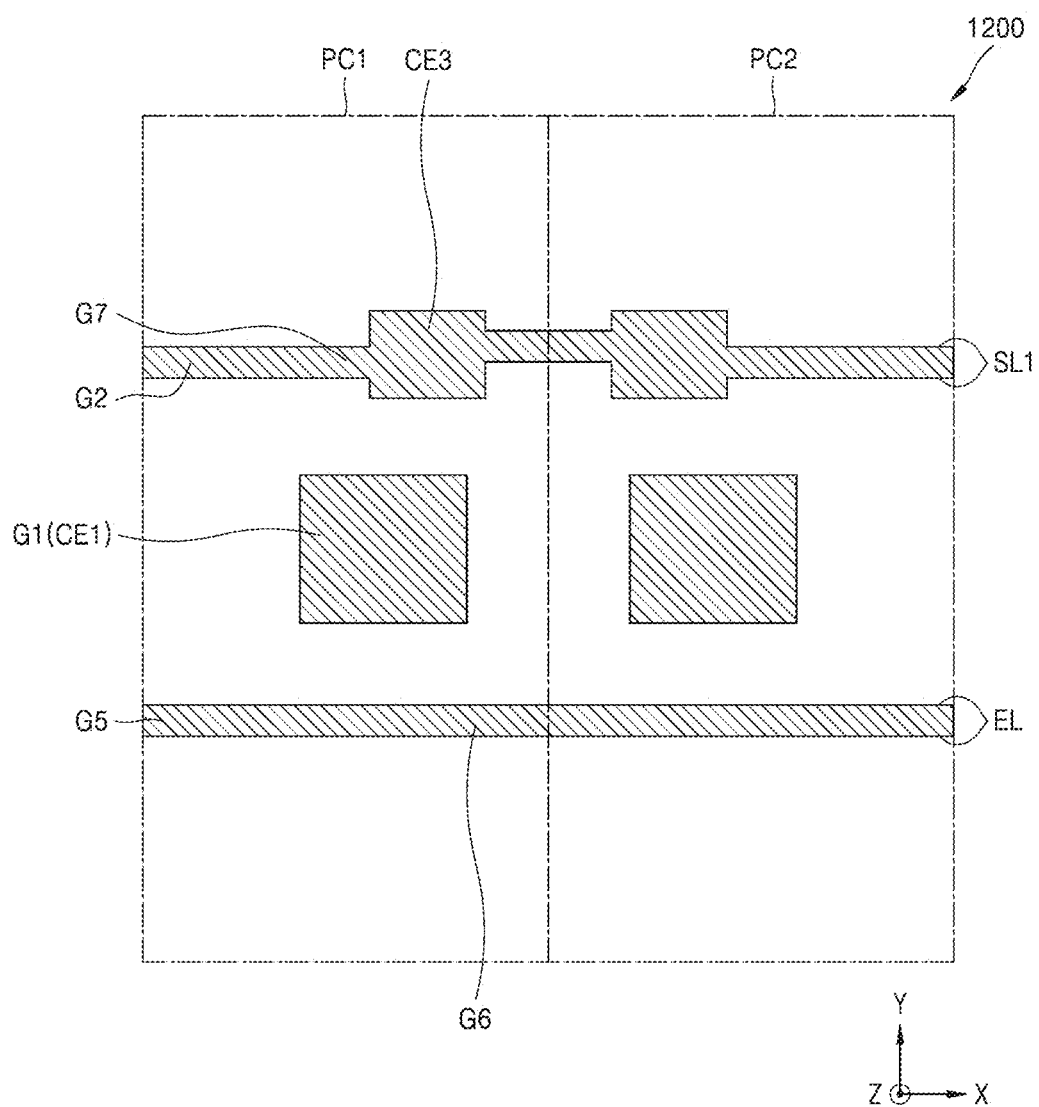

Referring to FIG. 9 in addition to FIG. 7, a second pattern layer 1200 may be disposed on the first pattern layer 1100, the second pattern layer 1200 including the driving gate electrode G1, the switching gate electrode G2, the operation control gate electrode G5, the emission control gate electrode G6, the second initialization gate electrode G7, a first electrode CE1 of the storage capacitor Cst, a third electrode CE3 of the boost capacitor Cbt, the first scan line SL1, and the emission control line EL. For example, a first gate insulating layer 112 (see FIG. 15) may be between the first pattern layer 1100 and the second pattern layer 1200 to insulate the first pattern layer 1100 and the second pattern layer 1200 from each other.

The second pattern layer 1200 may include a low-resistance conductive material such as molybdenum (Mo), aluminum (Al), copper (Cu), and/or titanium (Ti), and may have a single layered or multi-layered structure including the aforementioned material. That is, the driving gate electrode G1, the switching gate electrode G2, the operation control gate electrode G5, the emission control gate electrode G6, the second initialization gate electrode G7, the first electrode CE1 of the storage capacitor Cst, the third electrode CE3 of the boost capacitor Cbt, the first scan line SL1, and the emission control line EL may be disposed in the same layer and may include the same material.

The driving gate electrode G1 may be arranged to overlap the driving channel region of the driving semiconductor layer A1 in a plan view. In an embodiment, the storage capacitor Cst may be disposed to overlap the driving thin-film transistor T1 in an plan view. In this case, the driving gate electrode G1 may not only function as a gate electrode of the driving thin-film transistor T1, but also function as the first electrode CE1. That is, the driving gate electrode G1 may be formed integrally with the first electrode CE1. The first electrode CE1 may be formed as an island-shaped electrode.

The switching gate electrode G2 may be arranged to overlap the switching channel region of the switching semiconductor layer A2 in a plan view and may be a portion of the first scan line SL1.

The operation control gate electrode G5 may be arranged to overlap the operation control channel region of the operation control semiconductor layer A5 in a plan view and may be a portion of the emission control line EL.

The emission control gate electrode G6 may be arranged to overlap the emission control channel region of the emission control semiconductor layer A6 in a plan view and may be a portion of the emission control line EL. The operation control gate electrode G5, the emission control gate electrode G6, and the emission control line EL may be integrally formed.

The second initialization gate electrode G7 may be arranged to overlap the second initialization channel region of the second initialization semiconductor layer A7 in a plan view. FIGS. 7 and 9 illustrate a pixel circuit PC of an n-th row, as described above. In FIG. 9, the second initialization gate electrode G7 may be included in a pixel circuit PC of (n−1)-th row, and a next scan line SLn (see FIG. 6) of the pixel circuit PC of the (n−1)-th row may correspond to a first scan line SL1 of the pixel circuit PC of the n-th row. That is, the second initialization gate electrode G7 of the pixel circuit PC of the (n−1)-th row may be a portion of the first scan line SL1 of the pixel circuit PC of the n-th row, which is a portion of the next scan line SLn of the pixel circuit PC of the (n−1)-th row.

A third electrode CE3 of the boost capacitor Cbt may be integrally formed with the first scan line SL1 and may be connected to the switching gate electrode G2.

Figure 10:
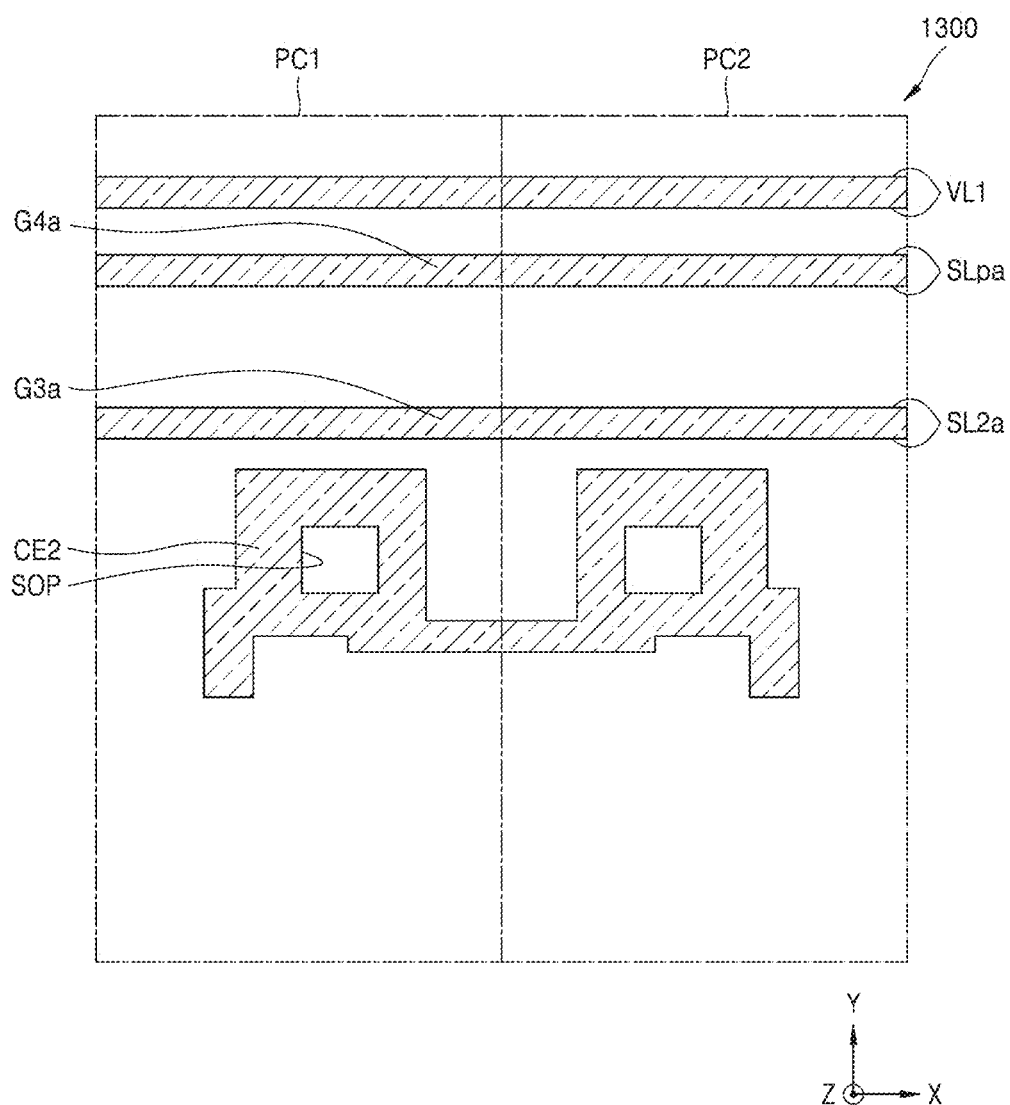

Referring to FIGS. 7 and 10, a third pattern layer 1300 may be arranged on the second pattern layer 1200, the third pattern layer 1300 including a second electrode CE2 of the storage capacitor Cst, a lower electrode G3a of the compensation gate electrode G3 of the compensation thin-film transistor T3, a lower electrode G4a of the first initialization gate electrode G4 of the first initialization thin-film transistor T4, a lower scan line SL2a of the second scan line SL2, a lower scan line SLpa of the previous scan line SLp, and the first initialization voltage line VL1. For example, a second gate insulating layer 113 (see FIG. 15) may be between the second pattern layer 1200 and the third pattern layer 1300 to insulate the second pattern layer 1200 and the third pattern layer 1300 from each other.

The third pattern layer 1300 may include a metal, an alloy, a conductive metal oxide, a transparent conductive material, or the like. For example, the third pattern layer 1300 may have a single layer or multiple layers including at least one of Mo, Cu, Ti, and the like. That is, the second electrode CE2 of the storage capacitor Cst, the lower electrode G3a of the compensation gate electrode G3, the lower scan line SL2a of the second scan line SL2, the lower scan line SLpa of the previous scan line SLp, the lower electrode G4a of the first initialization gate electrode G4, and the first initialization voltage line VL1 may be arranged in the same layer and may include the same material.

The second electrode CE2 of the storage capacitor Cst may be arranged to overlap the first electrode CE1 in a plan view. In this case, a second gate insulating layer 113 may be between the first electrode CE1 and the second electrode CE2, and the second gate insulating layer 113 may function as a dielectric layer of the storage capacitor Cst. Storage capacitance may be determined by charges stored in the storage capacitor Cst and a voltage between the first electrode CE1 and the second electrode CE2.

The second electrode CE2 may define a storage opening SOP therein. The storage opening SOP may overlap the first electrode CE1 in a plan view. The storage opening SOP may have a shape of a single closed curve penetrating through the second electrode CE2. The single closed curve means a closed figure (e.g., a polygon or a circle) with the same start point and end point when a point is drawn on a straight line or curve. The second electrode CE2 may be connected to the driving voltage line PL through a shielding layer SHL, which will be described later, to receive a driving power voltage ELVDD (see FIG. 6).

The lower electrode G3a of the compensation gate electrode G3 may be arranged to overlap the compensation channel region of the compensation semiconductor layer A3 in a plan view, and may be a portion of the lower scan line SL2a of the second scan line SL2.

The lower electrode G4a of the first initialization gate electrode G4 may be arranged to overlap the first initialization channel region of the first initialization semiconductor layer A4 in a plan view, and may be a portion of the lower scan line SLpa of the previous scan line SLp.

Figure 11:
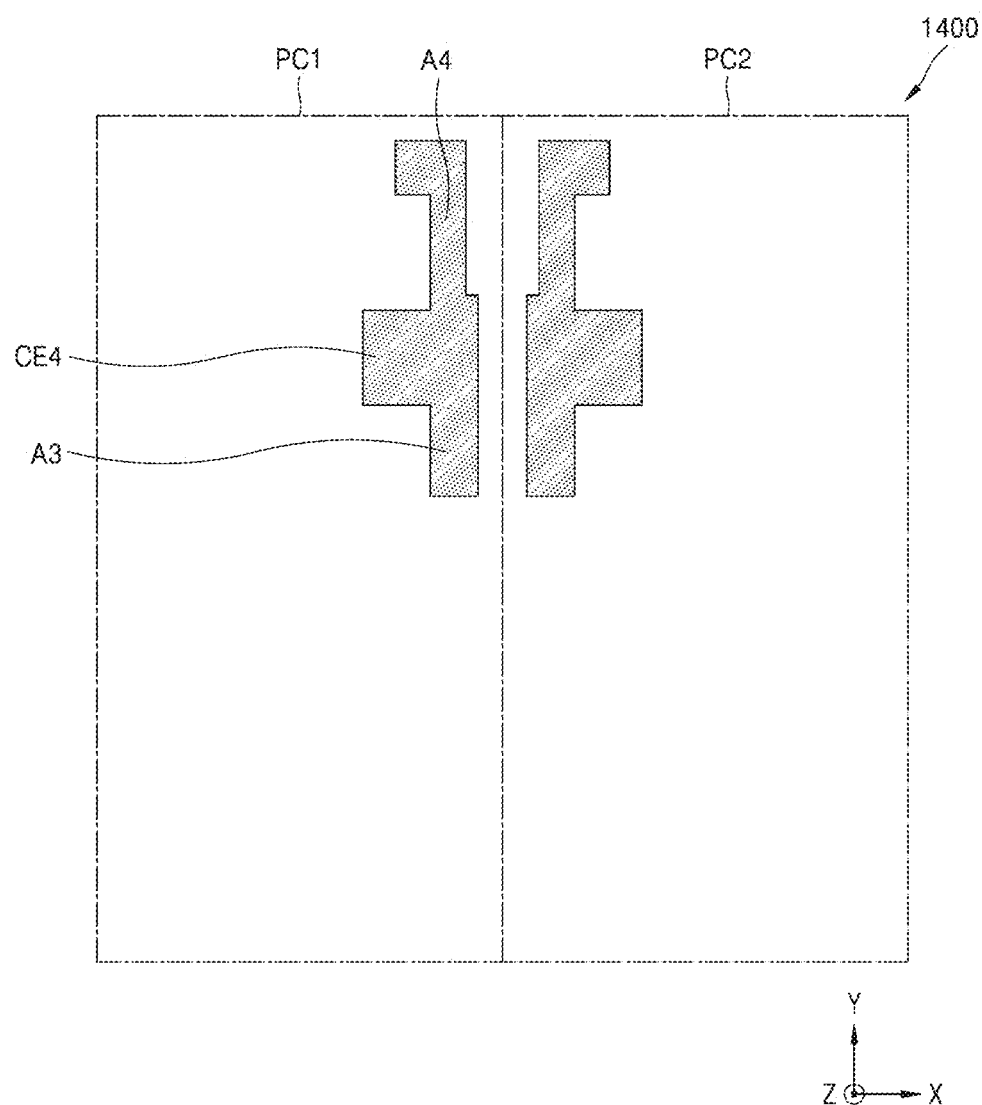

Referring to FIG. 11 in addition to FIG. 7, a fourth pattern layer 1400 including a compensation semiconductor layer A3 and a first initialization semiconductor layer A4 may be arranged on the third pattern layer 1300. The compensation semiconductor layer A3 and the first initialization semiconductor layer A4 may be integrally formed with each other and may have an island shape. For example, a first interlayer insulating layer 114 (see FIG. 15) may be between the third pattern layer 1300 and the fourth pattern layer 1400 to insulate the third pattern layer 1300 and the fourth pattern layer 1400 from each other.

In an embodiment, the fourth pattern layer 1400 may include a material different from that of the first pattern layer 1100. For example, the fourth pattern layer 1400 may include an oxide semiconductor material including oxides of at least one material selected from indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). In some embodiments, the oxide semiconductor material may be an In—Ga—Zn—O ("IGZO") semiconductor material containing a metal such as In and Ga in ZnO. That is, the compensation semiconductor layer A3 and the first initialization semiconductor layer A4 may be arranged in the same layer and may include the same material.

The fourth pattern layer 1400 may include a channel region, and a source region and a drain region on both sides of the channel region. For example, the source region and the drain region may be regions in which a carrier concentration is increased by plasma treatment. The source region and the drain region may correspond to a source electrode and a drain electrode, respectively. The source region and the drain region may be changed to each other according to the characteristics of a transistor. Hereinafter, the terms of a source region and a drain region are used instead of a source electrode or a drain electrode.

The compensation semiconductor layer A3 may include a compensation source region and a compensation drain region on both sides of a compensation channel region. One of the compensation source region and the compensation drain region may be bridge-connected to the first electrode CE1 of the storage capacitor Cst through the node connection line NC, and the other of the compensation source region and the compensation drain region may be bridge-connected to the first pattern layer 1100 through the fifth connection electrode 1650 (see FIG. 13). By the bridge connection through the fifth connection electrode 1650, the compensation semiconductor layer A3 may be connected to the driving semiconductor layer A1 of the driving thin-film transistor T1 and the emission control semiconductor layer A6 of the emission control thin-film transistor T6.

The first initialization semiconductor layer A4 may include a first initialization source region and a first initialization drain region on both sides of a first initialization channel region. One of the first initialization source region and the first initialization drain region may be bridge-connected to the first electrode CE1 of the storage capacitor Cst through the node connection line NC, and the other of the first initialization source region and the first initialization drain region may be bridge-connected to the first initialization voltage line VL1 through the sixth connection electrode 1660 (see FIG. 13).

A fourth electrode CE4 of the boost capacitor Cbt may be a portion of the fourth pattern layer 1400 and may be formed integrally with the compensation semiconductor layer A3 and the first initialization semiconductor layer A4. For example, the fourth electrode CE4 may be a portion of the fourth pattern layer 1400 between the first initialization semiconductor layer A4 and the compensation semiconductor layer A3, or a portion extending from the first initialization semiconductor layer A4 and/or the compensation semiconductor layer A3. The fourth electrode CE4 may be arranged to overlap the third electrode CE3 in a plan view, and a third electrode CE3 and a fourth electrode CE4 overlapping each other may form the boost capacitor Cbt. In this case, insulating layers between the third electrode CE3 and the fourth electrode CE4, for example, the second gate insulating layer 113 and the first interlayer insulating layer 114, may function as a dielectric layer of the boost capacitor Cbt.

Figure 12:
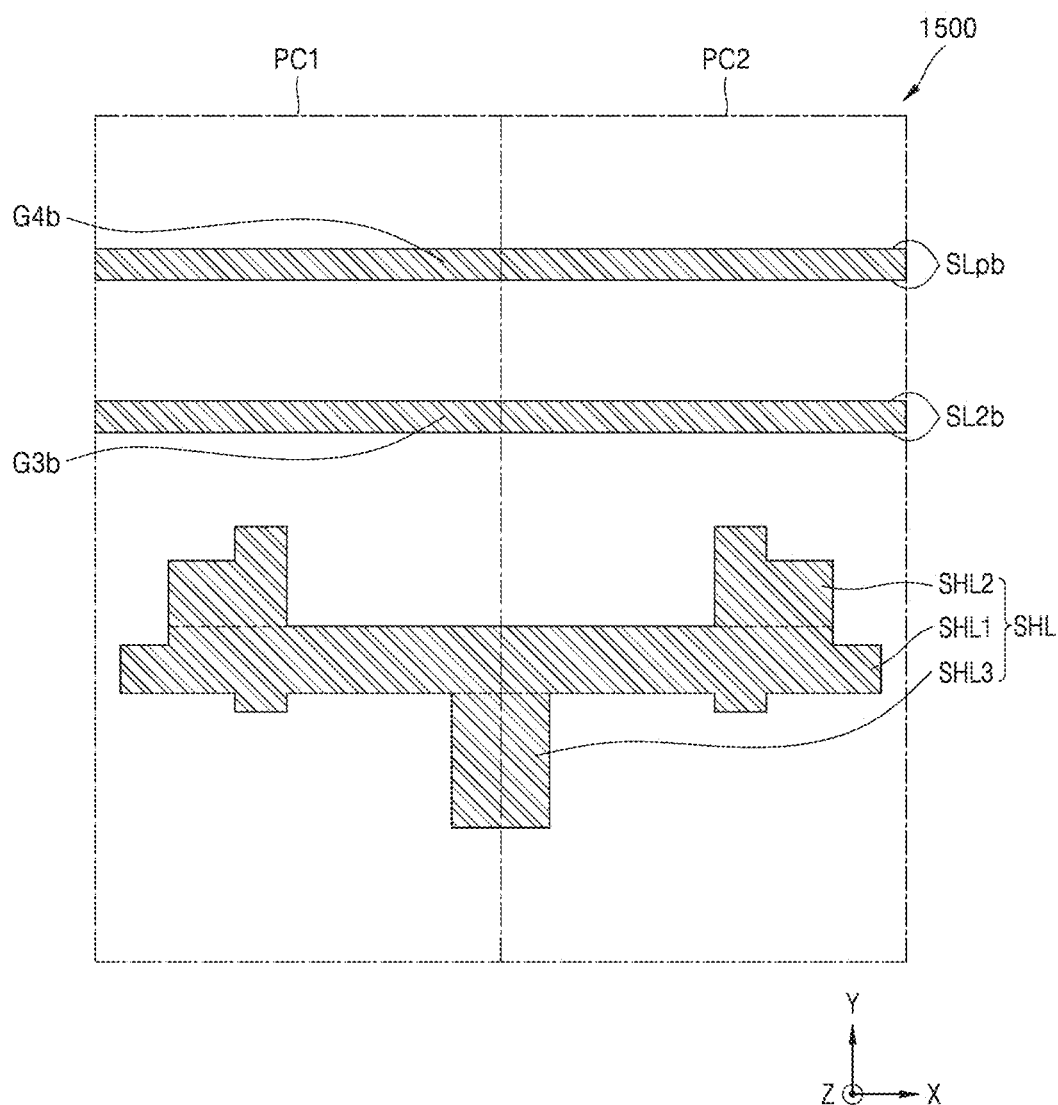

Referring to FIG. 12 in addition to FIG. 7, a fifth pattern layer 1500 may be arranged on the fourth pattern layer 1400, the fifth pattern layer 1500 including an upper electrode G3b of the compensation gate electrode G3 of the compensation thin-film transistor T3, an upper electrode G4b of the first initialization gate electrode G4 of the first initialization thin-film transistor T4, an upper scan line SL2b of the second scan line SL2, an upper scan line SLpb of the previous scan line SLp, and the shielding layer SHL. For example, a third gate insulating layer 115 (see FIG. 15) may be between the fourth pattern layer 1400 and the fifth pattern layer 1500 to insulate the fourth pattern layer 1400 and the fifth pattern layer 1500 from each other.

The fifth pattern layer 1500 may include a metal, an alloy, a conductive metal oxide, a transparent conductive material, or the like. For example, the fifth pattern layer 1500 may have a single layer or multiple layers including at least one of Mo, Cu, Ti, and the like. That is, the upper electrode G3b of the compensation gate electrode G3, the upper electrode G4b of the first initialization gate electrode G4, the upper scan line SL2b of the second scan line SL2, the upper scan line SLpb of the previous scan line SLp, and the shielding layer SHL may be arranged in the same layer and may include the same material.

The upper electrode G3b of the compensation gate electrode G3 may be arranged to overlap the compensation channel region of the compensation semiconductor layer A3 in a plan view, and may be a portion of the upper scan line SL2b of the second scan line SL2. The lower electrode G3a and the upper electrode G3b of the compensation gate electrode G3 may overlap each other in a plan view and may be located opposite to each other with the compensation semiconductor layer A3 therebetween. Accordingly, the compensation gate electrode G3 may have a double gate structure.

The upper electrode G4b of the first initialization gate electrode G4 may be arranged to overlap the first initialization channel region of the first initialization semiconductor layer A4 in a plan view, and may be a portion of the upper scan line SLpb of the previous scan line SLp. The lower electrode G4a and the upper electrode G4b of the first initialization gate electrode G4 may overlap each other in a plan view, and may be located opposite to each other with the first initialization semiconductor layer A4 therebetween. Accordingly, the first initialization gate electrode G4 may have a double gate structure.

In another embodiment, the compensation thin-film transistor T3 and the first initialization thin-film transistor T4 may have a single gate structure, and may have only the upper electrode G3b and the upper electrode G4b, respectively.

In the double gate structure, a lower electrode and an upper electrode of a gate electrode have to be electrically connected to each other. That is, the lower electrode G3a and the upper electrode G3b of the compensation gate electrode G3 have to be electrically connected to each other, and the lower electrode G4a and the upper electrode G4b of the first initialization gate electrode G4 have to be electrically connected to each other.

According to an embodiment of the disclosure, in the peripheral area PA (see FIG. 1) outside the display area DA (see FIG. 1), the lower scan line SL2a and the upper scan line SL2b of the second scan line SL2 may be electrically connected to each other, and the lower scan line SLpa and the upper scan line SLpb of the previous scan line SLp may be electrically connected to each other. Accordingly, formation of a contact hole for electrically connecting the lower electrode G3a and the upper electrode G3b of the compensation gate electrode G3 to each other, and formation of a contact hole for electrically connecting the lower electrode G4a and the upper electrode G4b of the first initialization gate electrode G4 to each other may be omitted in a pixel area. Therefore, a process of patterning the contact holes in insulating layers (i.e., the first interlayer insulating layer 114 and the third gate insulating layer 115) between the third pattern layer 1300 and the fifth pattern layer 1500 may be omitted, and thus, the use of one mask for the patterning may be effectively reduced. As a result, processes may be simplified and the effect of cost reduction may be obtained.

The display device 1 according to an embodiment may include a shielding layer SHL. For example, the shielding layer SHL may have an island shape. In an embodiment, the shielding layer SHL may overlap a portion of the first pattern layer 1100 in a plan view and may not overlap the fourth pattern layer 1400 in a plan view. For example, the shielding layer SHL may overlap at least a portion of the driving thin-film transistor T1 in a plan view and may not overlap the compensation semiconductor layer A3 and the first initialization semiconductor layer A4 in a plan view.

In addition, in an embodiment, the shielding layer SHL may overlap at least a portion of the horizontal connection line HCL in a plan view. For example, the shielding layer SHL may include a first portion SHL1 extending in a second direction (e.g., +x direction) to overlap at least a portion of the horizontal connection line HCL in a plan view. In another embodiment, the shielding layer SHL may overlap at least a portion of the vertical connection line VCL in a plan view. For example, the shielding layer SHL may further include a second portion SHL2 extending in a first direction (e.g., +y direction) from the first portion SHL1 to overlap at least a portion of the vertical connection line VCL in a plan view.

In another embodiment, the shielding layer SHL may further include a third portion SHL3 extending in a third direction (e.g., −y direction) from the first portion SHL1.

The third portion SHL3 may overlap the fourth connection electrode 1640 (see FIG. 13) and a portion of the driving voltage line PL in a plan view.

The shape of the shielding layer SHL shown in FIG. 12 in a plan view is only an example, and the disclosure according to the invention is not limited thereto. The shielding layer SHL may have various shapes to overlap at least a portion of the driving thin-film transistor T1 and at least a portion of the horizontal connection line HCL in a plan view.

Referring to FIG. 13 in addition to FIG. 7, a sixth pattern layer 1600 may be arranged on the fifth pattern layer 1500, the sixth pattern layer 1600 including a node connection line NC, a second initialization voltage line VL2, a horizontal connection line HCL, and first to sixth connection electrodes 1610, 1620, 1630, 1640, 1650, and 1660. For example, a second interlayer insulating layer 116 (see FIG. 15) may be between the fifth pattern layer 1500 and the sixth pattern layer 1600 to insulate the fifth pattern layer 1500 and the sixth pattern layer 1600 from each other.

The sixth pattern layer 1600 may include, for example, a conductive material including Al, Cu, Ti, Mo, etc., and may have a multi-layered or single layered structure including the aforementioned conductive material. For example, the sixth pattern layer 1600 may have a multi-layered structure of Ti/Al/Ti. That is, the node connection line NC, the second initialization voltage line VL2, the horizontal connection line HCL, and the first to sixth connection electrodes 1610, 1620, 1630, 1640, 1650, and 1660 may be arranged in the same layer and may include the same material.

The node connection line NC may extend in a first direction (e.g., +y direction), and may bridge-connect the driving thin-film transistor T1 to the compensation thin-film transistor T3 and the first initialization thin-film transistor T4. For example, one end of the node connection line NC may be connected to the driving gate electrode G1 (or the first electrode CE1 of the storage capacitor Cst) through a contact hole, and the other end of the node connection line NC may be connected to the compensation semiconductor layer A3 and the first initialization semiconductor layer A4 through a contact hole.

The second initialization voltage line VL2 may extend in a second direction (e.g., +x direction) as a whole. For example, the second initialization voltage line VL2 may have a shape that is bent multiple times, such as an omega (Ω) or an alphabet "S" to bypass the node connection line NC. The second initialization voltage line VL2 may be connected to the second initialization semiconductor layer A7 of the second initialization thin-film transistor T7 through a contact hole.

The horizontal connection line HCL may extend in the second direction (e.g., the +x direction). The horizontal connection line HCL may include a portion partially bent to extend in a direction different from the second direction, but even in this case, the horizontal connection line HCL may extend in the second direction as a whole. The horizontal connection line HCL may be arranged for each pixel area, and may be a portion of the connection line CL described above with reference to FIG. 4.

The horizontal connection line HCL may be spaced farther from the compensation thin-film transistor T3 than the driving thin-film transistor T1 in a plan view. For example, the horizontal connection line HCL may be spaced farther from the compensation semiconductor layer A3 of the compensation thin-film transistor T3 than the driving semiconductor layer A1 of the driving thin-film transistor T1. In addition, the horizontal connection line HCL may be further spaced apart from the first initialization thin-film transistor T4 in a plan view. In an embodiment, the horizontal connection line HCL may not overlap the node connection line NC in a plan view.

FIG. 13 shows that the horizontal connection line HCL extends in the second direction (the +x direction) without disconnection, however, the horizontal connection line HCL may be disconnected at a specific pixel PX. Specifically, the horizontal connection line HCL may include a first horizontal connection line and a second horizontal connection line which extends in a same direction as the first horizontal connection line and is apart from the first horizontal connection line. In this case, the disconnected portion of the horizontal connection line HCL locates between the first horizontal connection line and the second horizontal connection line. For example, FIG. 4 shows that the first portion CLa and the second portion CLb are electrically connected each other at the first node N1. The horizontal connection line HCL of the first portion CLa may be disconnected at a portion of the horizontal connection line HCL near the first node N1. The disconnected portion of the horizontal connection line HCL may locate in the −x direction from the first node N1.

The first connection electrode 1610 may be electrically connected to the switching semiconductor layer A2 thereunder through a contact hole.

The second connection electrode 1620 may be electrically connected to the shielding layer SHL thereunder through a contact hole, and may be electrically connected to the operation control semiconductor layer A5 thereunder through another contact hole. As described above, because the shielding layer SHL is electrically connected to the driving voltage line PL and receives the driving power voltage ELVDD, the second connection electrode 1620 may transmit the driving power voltage ELVDD supplied through the shielding layer SHL to the operation control semiconductor layer A5.

The third connection electrode 1630 may be electrically connected to the emission control semiconductor layer A6 thereunder through a contact hole.

The fourth connection electrode 1640 may be electrically connected to the second electrode CE2 of the storage capacitor Cst thereunder through a contact hole, and may be electrically connected to the shielding layer SHL thereunder through another contact hole.

The fifth connection electrode 1650 may bridge-connect the compensation thin-film transistor T3 to the driving thin-film transistor T1 and the emission control thin-film transistor T6. For example, one end of the fifth connection electrode 1650 may be connected to the compensation semiconductor layer A3 through a contact hole, and the other end of the fifth connection electrode 1650 may be connected to the driving semiconductor layer A1 and the emission control semiconductor layer A6 through a contact hole.

The sixth connection electrode 1660 may be electrically connected to the first initialization semiconductor layer A4 thereunder through a contact hole, and may be electrically connected to the first initialization voltage line VL1 thereunder through another contact hole.

Referring to FIG. 14 in addition to FIG. 7, a seventh pattern layer 1700 may be arranged on the sixth pattern layer 1600, the seventh pattern layer 1700 including a data line DL, a vertical connection line VCL, a driving voltage line PL, and a seventh connection electrode 1710. For example, a first organic insulating layer 117 (see FIG. 15) may be between the sixth pattern layer 1600 and the seventh pattern layer 1700 to insulate the sixth pattern layer 1600 and the seventh pattern layer 1700 from each other.

The seventh pattern layer 1700 may include, for example, a conductive material including Al, Cu, Ti, Mo, etc., and may have a multi-layered or single layered structure including the aforementioned conductive material. For example, the seventh pattern layer 1700 may have a multi-layered structure of Ti/Al/Ti. That is, the data line DL, the vertical connection line VCL, the driving voltage line PL, and the seventh connection electrode 1710 may be arranged in the same layer and may include the same material.

The data line DL may extend in a first direction (e.g., +y direction), and may be electrically connected to the first connection electrode 1610 thereunder through a contact hole. As described above, because the first connection electrode 1610 is connected to the switching semiconductor layer A2, the data line DL may apply a data signal to the switching semiconductor layer A2 through the first connection electrode 1610.

The vertical connection line VCL may extend in the first direction (e.g., the +y direction). The vertical connection line VCL may include a portion partially bent to extend in a direction different from the first direction, but even in this case, the vertical connection line VCL may extend in the first direction as a whole. For example, the vertical connection line VCL may be arranged for each pixel area, and may be a portion of the connection line CL described with reference to FIG. 4.

FIG. 14 shows that the vertical connection line VCL extends in the first direction (the +y direction) without disconnection, however, the vertical connection line VCL may be disconnected at a specific pixel PX. Specifically, the vertical connection line VCL may include a first vertical connection line and a second vertical connection line which extends in a same direction as the first vertical connection line and is apart from the first vertical connection line. In this case, the disconnected portion of the vertical connection line VCL locates between the first vertical connection line and the second vertical connection line. For example, FIG. 4 shows that the first portion CLa and the second portion CLb are electrically connected each other at the first node N1. The vertical connection line VCL forming the second portion CLb may be disconnected at a portion of the vertical connection line VCL near the first node N1. The disconnected portion of the vertical connection line VCL may locate in the +y direction from the first node N1.

The driving voltage line PL may extend in the first direction (e.g., the +y direction). The width of the driving voltage line PL in the second direction may vary along an extension direction (i.e., the first direction). The driving voltage line PL may be electrically connected to the fourth connection electrode 1640 through a contact hole. As described above, because the fourth connection electrode 1640 is electrically connected to the second electrode CE2 of the storage capacitor Cst and the shielding layer SHL, the driving voltage line PL may apply the driving power voltage ELVDD (see FIG. 6) to the second electrode CE2 and the shielding layer SHL through the fourth connection electrode 1640.

Figure 15:
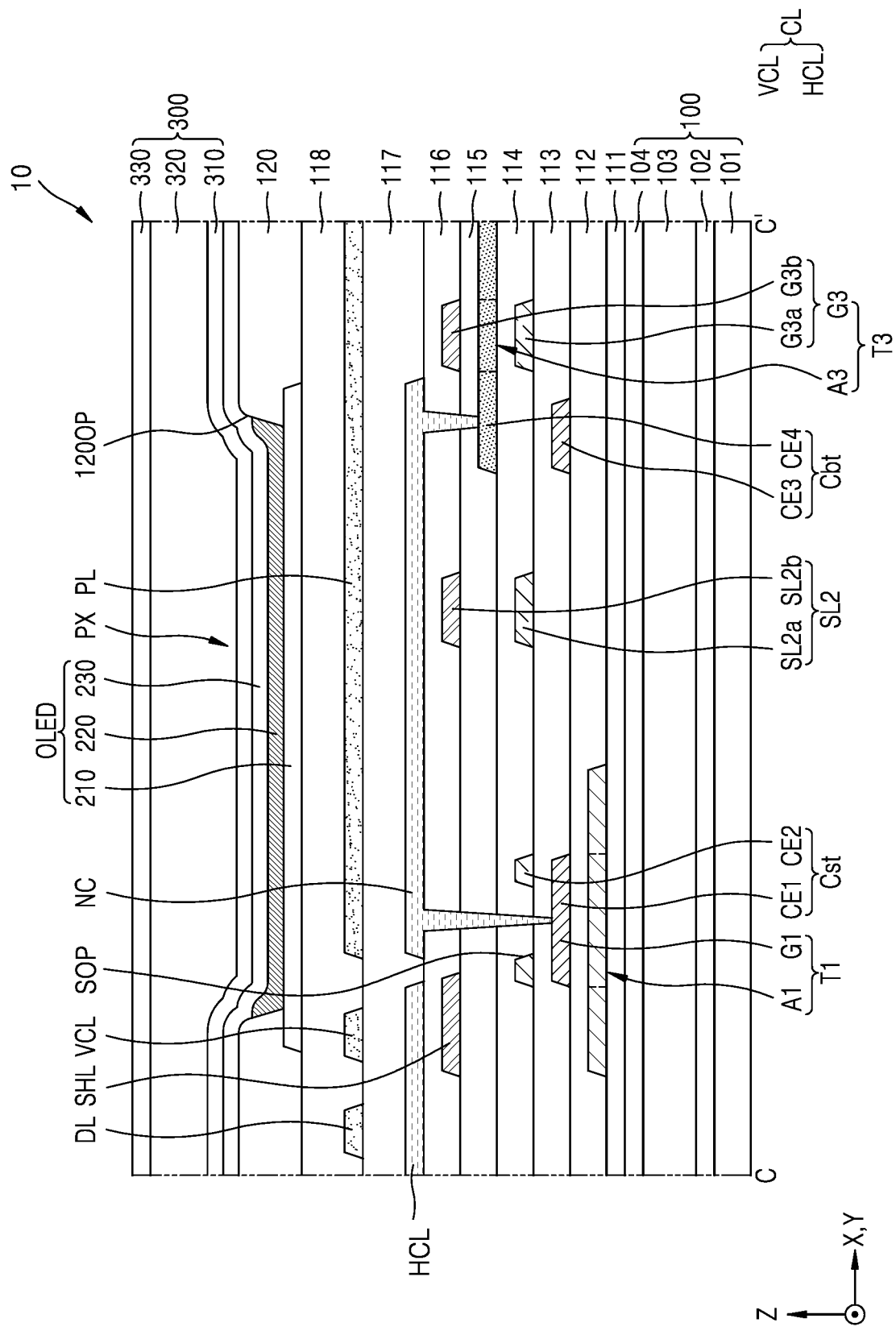
FIG. 15 is a schematic cross-sectional view of a portion of a display panel, taken along line C-C' of FIG. 7.

FIG. 15 is a schematic cross-sectional view of a portion of a display panel 10, taken along line C-C' of FIG. 7.

Hereinafter, a stacked structure of a display panel 10 according to an embodiment will be described in detail with reference to FIG. 15.

Referring to FIG. 15, a display panel 10 may include a substrate 100. The substrate 100 may include a glass material, a ceramic material, a metal material, or a polymer resin. In an embodiment, the substrate 100 may include a polymer resin such as polyethersulfone ("FES"), polyacrylate, polyetherimide ("PEI"), polyethylene naphthalate ("PEN"), polyethylene terephthalate ("PET"), polyphenylene sulfide ("PPS"), polyarylate, polyimide ("PI"), polycarbonate ("PC"), or cellulose acetate propionate ("CAP"). When the substrate 100 includes a polymer resin, the substrate 100 may have flexible or bendable characteristics.

The substrate 100 may have a single layered or multi-layered structure including the aforementioned material, and may further include an inorganic layer in the case of the multi-layered structure. For example, the substrate 100 may include a first organic base layer 101, a first inorganic barrier layer 102, a second organic base layer 103, and a second inorganic barrier layer 104. Each of the first organic base layer 101 and the second organic base layer 103 may include a polymer resin. The first inorganic barrier layer 102 and the second inorganic barrier layer 104 may prevent the penetration of foreign materials, and may each have a single layer or multiple layers including an inorganic material such as silicon nitride (SiNx) or silicon oxide (SiOx).

A buffer layer 111 may be arranged on the substrate 100. The buffer layer 111 may increase the smoothness of the upper surface of the substrate 100, and the buffer layer 111 may be an oxide layer including SiOx, a nitride layer including SiNx, or a layer including silicon oxynitride (SiOxNy).

The first pattern layer 1100 (see FIG. 8) may be arranged on the buffer layer 111, and in FIG. 15, the driving semiconductor layer A1 of the driving thin-film transistor T1 in the first pattern layer 1100 is shown. As described above, the driving semiconductor layer A1 may include a driving channel region, and a driving source region and a driving drain region on both sides of the driving channel region. In an embodiment, the driving semiconductor layer A1 may be a silicon semiconductor layer including a silicon semiconductor material.

A first gate insulating layer 112 may be located on the driving semiconductor layer A1. The first gate insulating layer 112 may include an inorganic material including oxide or nitride. For example, the first gate insulating layer 112 may include at least one of $SiO_2$, SiNx, SiOxNy, aluminum oxide ($Al_2O_3$), titanium oxide ($TiO_2$), tantalum oxide ($Ta_2O_5$), hafnium oxide ($HfO_2$), zinc oxide (ZnOx), and the like.

The second pattern layer 1200 (see FIG. 9) may be arranged on the first gate insulating layer 112, and in FIG. 15, the driving gate electrode G1 of the driving thin-film transistor T1 and the third electrode CE3 of the boost capacitor Cbt in the second pattern layer 1200 are shown. As described above, the driving gate electrode G1 of the driving thin-film transistor T1 may not only function as a gate electrode of the driving thin-film transistor T1, but also function as the first electrode CE1 of the storage capacitor Cst.

A second gate insulating layer 113 may be arranged on the driving gate electrode G1 and the third electrode CE3. The second gate insulating layer 113 may include an inorganic material including oxide or nitride. For example, the second gate insulating layer 113 may include at least one of $SiO_2$, SiNx, SiOxNy, $Al_2O_3$, $TiO_2$, $Ta_2O_5$, $HfO_2$, $ZnO_2$, and the like.

The third pattern layer 1300 (see FIG. 10) may be arranged on the second gate insulating layer 113, and in FIG. 15, the second electrode CE2 of the storage capacitor Cst and the lower scan line SL2a of the second scan line SL2 in the third pattern layer 1300 are shown. The second electrode CE2 of the storage capacitor Cst may be arranged to overlap the first electrode CE1 in a plan view and may define a storage opening SOP therein. As described above, the second gate insulating layer 113 may function as a dielectric layer of the storage capacitor Cst.

An area where the lower scan line SL2a of the second scan line SL2 overlaps the compensation semiconductor layer A3 of the compensation thin-film transistor T3 in a plan view may be the lower electrode G3a of the compensation gate electrode G3 of the compensation thin-film transistor T3.

A first interlayer insulating layer 114 may be arranged on the second electrode CE2 of the storage capacitor Cst and the lower scan line SL2a of the second scan line SL2. The first interlayer insulating layer 114 may include an inorganic material including oxide or nitride. For example, the first interlayer insulating layer 114 may include at least one of $SiO_2$, SiNx, SiOxNy, $Al_2O_3$, $TiO_2$, $Ta_2O_5$, $HfO_2$, $ZnO_2$, and the like.

The fourth pattern layer 1400 (see FIG. 11) may be arranged on the first interlayer insulating layer 114, and in FIG. 15, the compensation semiconductor layer A3 of the compensation thin-film transistor T3 and the fourth electrode CE4 of the boost capacitor Cbt in the fourth pattern layers 1400 are shown. As described above, the compensation semiconductor layer A3 may include a compensation channel region, and a compensation source region and a compensation drain region on both sides of the channel region. In an embodiment, the compensation semiconductor layer A3 may include an oxide semiconductor material.

The fourth electrode CE4 of the boost capacitor Cbt may be arranged to overlap the third electrode CE3 in a plan view, and the second gate insulating layer 113 and the first interlayer insulating layer 114 may be between the third electrode CE3 and the fourth electrode CE4. The second gate insulating layer 113 and the first interlayer insulating layer 114 may function as a dielectric layer of the boost capacitor Cbt.

A third gate insulating layer 115 may be arranged on the compensation semiconductor layer A3 and the fourth electrode CE4. The third gate insulating layer 115 may include an inorganic material including oxide or nitride. For example, the third gate insulating layer 115 may include at least one of $SiO_2$, SiNx, SiOxNy, $Al_2O_3$, $TiO_2$, $Ta_2O_5$, $HfO_2$, $ZnO_2$, and the like.

The fifth pattern layer 1500 (see FIG. 12) may be arranged on the third gate insulating layer 115, and in FIG. 15, the upper scan line SL2b of the second scan line SL2 and the shielding layer SHL in the fifth pattern layer 1500 are shown. An area where the upper scan line SL2b of the second scan line SL2 overlaps the compensation semiconductor layer A3 of the compensation thin-film transistor T3 in a plan view may be the upper electrode G3b of the compensation gate electrode G3 of the compensation thin-film transistor T3.

In an embodiment, the shielding layer SHL may be between the driving semiconductor layer A1 and the connection line CL in a cross-section. Here, "in a cross-section" may mean "on a virtual plane perpendicular to one surface of the substrate 100". For example, the shielding layer SHL may be between the driving semiconductor layer A1 and the horizontal connection line HCL, and may be between the driving semiconductor layer A1 and the vertical connection line VCL.

A second interlayer insulating layer 116 may be arranged on the upper scan line SL2b of the second scan line SL2 and the shielding layer SHL. The second interlayer insulating layer 116 may include an inorganic material including oxide or nitride. For example, the second interlayer insulating layer 116 may include at least one of $SiO_2$, SiNx, SiOxNy, $Al_2O_3$, $TiO_2$, $Ta_2O_5$, $HfO_2$, $ZnO_2$, and the like.

The sixth pattern layer 1600 (see FIG. 13) may be arranged on the second interlayer insulating layer 116, and in FIG. 15, the node connection line NC and the horizontal connection line HCL in the sixth pattern layer 1600 are shown. The node connection line NC may be connected at one end thereof to the driving gate electrode G1 of the driving thin-film transistor T1 through a contact hole defined in the second gate insulating layer 113, the first interlayer insulating layer 114, the third gate insulating layer 115, and the second interlayer insulating layer 116. The node connection line NC may be connected at the other end thereof to the compensation semiconductor layer A3 of the compensation thin-film transistor T3 through a contact hole defined in the third gate insulating layer 115 and the second interlayer insulating layer 116. Accordingly, the node connection line NC may electrically connect the driving gate electrode G1 to the compensation semiconductor layer A3.

In an embodiment, the horizontal connection line HCL may be in the same layer as the node connection line NC and include the same material as the node connection line NC. A first organic insulating layer 117 may be arranged on the node connection line NC and the horizontal connection line HCL. The first organic insulating layer 117 may have a flat upper surface. The first organic insulating layer 117 may include, for example, an organic material such as acrylic, benzocyclobutene ("BCB"), polyimide, or hexamethyldisiloxane ("HMDSO").

The seventh pattern layer 1700 (see FIG. 14) may be arranged on the first organic insulating layer 117, and in FIG. 15, the data line DL, the vertical connection line VCL, and the driving voltage line PL in the seventh pattern layer 1700 are shown. In an embodiment, the vertical connection line VCL may be arranged in the same layer and include the same material as the data line DL and the driving voltage line PL.

A second organic insulating layer 118 may be arranged on the data line DL, the vertical connection line VCL, and the driving voltage line PL. The second organic insulating layer 118 may have a flat upper surface. The second organic insulating layer 118 may include an organic material such as acrylic, BCB, polyimide, or HMDSO.

A pixel electrode 210 may be arranged on the second organic insulating layer 118. The pixel electrode 210 may include a light-transmitting conductive layer including a light-transmitting conductive oxide such as ITO, $In_2O_3$, or IZO, and a reflective layer including a metal such as Al or Ag. For example, the pixel electrode 210 may have a three-layered structure of ITO/Ag/ITO.

A pixel-defining layer 120 may be arranged on the pixel electrode 210, and the pixel-defining layer 120 may define an opening corresponding to each pixel PX, that is, an opening 1200P exposing at least a central portion of the pixel electrode 210, to define an emission area of the pixel PX. In addition, by increasing the distance between the edge of the pixel electrode 210 and the opposite electrode 230, the pixel-defining layer 120 may prevent an arc or the like from occurring therebetween. The pixel-defining layer 120 may include an organic material such as polyimide or HMDSO.

An intermediate layer 220 may be arranged on the pixel-defining layer 120. The intermediate layer 220 may be arranged between the pixel electrode 210 and the opposite electrode 230.

The intermediate layer 220 may include an emission layer corresponding to the pixel electrode 210. The emission layer may include an organic light-emitting material such as a polymer or low-molecular organic material emitting light of a certain color. Alternatively, the emission layer may include an inorganic light-emitting material or may include quantum dots.

In another embodiment, below and above the emission layer, functional layers such as a hole transport layer ("HTL"), a hole injection layer ("HIL"), an electron transport layer ("ETL"), and an electron injection layer ("EIL") may be further arranged. For example, a first functional layer among the functional layers may be an HTL having a single-layered structure, and may include poly-(3,4)-ethylene-dihydroxy thiophene ("PEDOT") or polyaniline ("PANI"). Alternatively, the first functional layer may include an HIL and an HTL. Among the functional layers, a second functional layer may include an ETL and/or an EIL.

Although FIG. 15 illustrates that the intermediate layer 220 corresponds to one pixel electrode 210 as an example, the disclosure according to the invention is not limited thereto. As another example, the intermediate layer 220 may be variously modified as an integral layer over a plurality of pixel electrodes 210.

The opposite electrode 230 may be arranged on the intermediate layer 220 and may be arranged to cover the display area DA. That is, the opposite electrode 230 may be integrally formed to cover the plurality of pixel electrodes 210. The opposite electrode 230 may extend from the display area DA (see FIG. 1) to the peripheral area PA (see FIG. 1). The opposite electrode 230 may include a conductive material having a low work function. For example, the opposite electrode 230 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the opposite electrode 230 may further include a layer including ITO, IZO, ZnO, or $In_2O_3$ on the (semi)transparent layer including the aforementioned material.

A stacked structure including the pixel electrode 210, the intermediate layer 220, and the opposite electrode 230 may form an organic light-emitting diode OLED as a light-emitting element. The emission area of each organic light-emitting diode OLED may be defined as a pixel PX. Because the opening 1200P of the pixel-defining layer 120 defines the size and/or width of the emission area, the size and/or width of the pixel PX may depend on the size and/or width of the opening 1200P of the pixel-defining layer 120.

In another embodiment, a capping layer (not shown) may be disposed on the opposite electrode 230. The capping layer may include an organic insulating material and/or an inorganic insulating material such as silicon nitride. The capping layer may cover the display area DA and may extend from the display area DA to the peripheral area PA.

An encapsulation layer 300 may cover a plurality of organic light-emitting diodes OLED and may prevent damage by moisture or oxygen from the outside. The encapsulation layer 300 may cover the display area DA and may extend from the display area DA to the peripheral area PA. The encapsulation layer 300 may include at least one inorganic encapsulation layer and at least one organic encapsulation layer. FIG. 15 illustrates, for example, a case where the encapsulation layer 300 includes a first inorganic encapsulation layer 310, an organic encapsulation layer 320, and a second inorganic encapsulation layer 330.

The first inorganic encapsulation layer 310 may cover the opposite electrode 230 and may include silicon oxide, silicon nitride, and/or silicon oxynitride. Because the first inorganic encapsulation layer 310 is disposed along a structure thereunder, the upper surface of the first inorganic encapsulation layer 310 is not flat. The organic encapsulation layer 320 may cover the first inorganic encapsulation layer 310, and unlike the first inorganic encapsulation layer 310, the upper surface of the organic encapsulation layer 320 may be substantially flat. Specifically, the upper surface of the organic encapsulation layer 320 may be substantially flat in a portion corresponding to the display area DA. The organic encapsulation layer 320 may include a polymer-based material. Examples of the polymer-based material may include acrylic resin, epoxy resin, polyimide, polyethylene, and the like. The acrylic resin may include, for example, polymethyl methacrylate, polyacrylic acid, or the like. The organic encapsulation layer 320 may have transparency. The second inorganic encapsulation layer 330 may cover the organic encapsulation layer 320 and may include silicon oxide, silicon nitride, and/or silicon oxynitride.

The first and second inorganic encapsulation layers 310 and 330 may be formed by a chemical vapor deposition ("CVD") process, and the organic encapsulation layer 320 may be formed through a process of coating an organic material in a liquid form on the substrate 100 and then curing the organic material.

Figure 16:
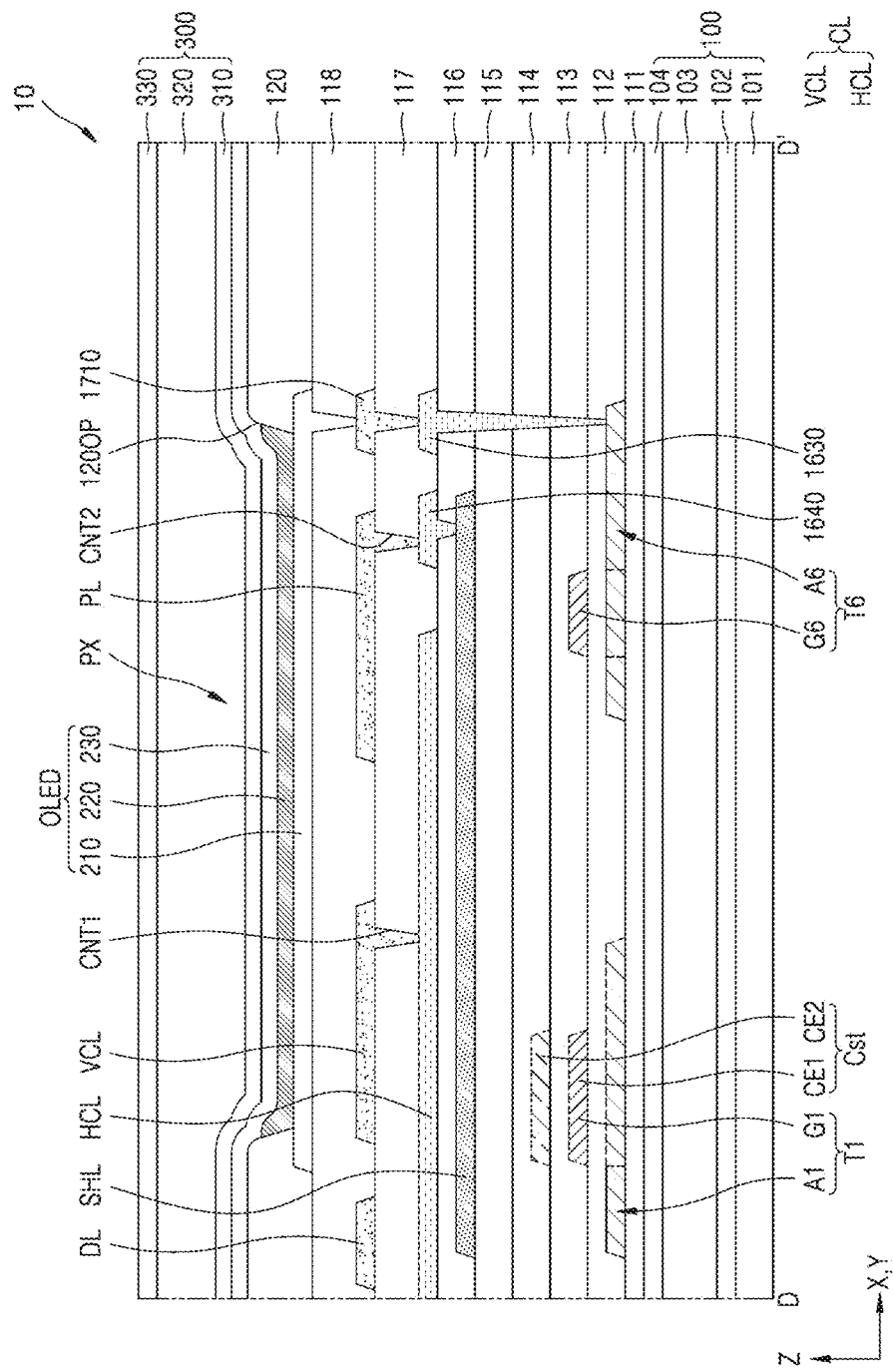
FIG. 16 is a schematic cross-sectional view of a portion of a display panel, taken along line D-D' of FIG. 7.

FIG. 16 is a schematic cross-sectional view of a portion of a display panel 10, taken along line D-D' of FIG. 7. Components that are the same as or correspond to components described above with reference to FIG. 15 are rendered the same reference numeral, and detailed descriptions thereof will be omitted.

In FIG. 16, a portion of the driving semiconductor layer A1 of the driving thin-film transistor T1 is shown by a dashed line. This is for illustrating the location of the driving semiconductor layer A1 in the cross-sectional view of FIG. 16 for convenience of description, although line D-D' of FIG. 7 does not pass through the driving semiconductor layer A1.

Referring to FIG. 16, the emission control semiconductor layer A6 of the emission control thin-film transistor T6 may be located on the buffer layer 111, and the emission control gate electrode G6 of the emission control thin-film transistor T6 may be located on the first gate insulating layer 112.

The pixel electrode 210 may be electrically connected to the emission control thin-film transistor T6 and may receive a driving current. For example, the pixel electrode 210 may be connected to the seventh connection electrode 1710 through a contact hole defined in the second organic insulating layer 118, and the seventh connection electrode 1710 may be connected to the third connection electrode 1630 through a contact hole defined in the first organic insulating layer 117. The third connection electrode 1630 may be connected to the emission control semiconductor layer A6 through a contact hole defined in insulating layers (i.e., the first gate insulating layer 112, the second gate insulating layer 113, the first interlayer insulating layer 114, the third gate insulating layer 115, and the second interlayer insulating layer 116) between the third connection electrode 1630 and the emission control semiconductor layer A6. As a result, the pixel electrode 210 may be electrically connected to the emission control semiconductor layer A6 through the third connection electrode 1630 and the seventh connection electrode 1710.

The horizontal connection line HCL and the vertical connection line VCL may be electrically connected to each other. For example, the vertical connection line VCL may be electrically connected to the horizontal connection line HCL through a contact hole (hereinafter, referred to as a first contact hole CNT1) defined in the first organic insulating layer 117. As described above, the horizontal connection line HCL and the vertical connection line VCL, that is, the connection line CL may be wiring lines for transmitting data signals.

When the connection line CL overlaps or is adjacent to the driving thin-film transistor T1 in a plan view, the connection line CL and the driving thin-film transistor T1 may affect each other. For example, a parasitic capacitance may occur between the connection line CL and the driving gate electrode G1 of the driving thin-film transistor T1, and thus, due to a coupling phenomenon, a data signal transmitted through the connection line CL may be delayed or display quality may be deteriorated.

In order to solve this problem, in an embodiment of the disclosure, a shielding layer SHL may be located between the connection line CL and the driving thin-film transistor T1 in a cross-section view. In addition, the shielding layer SHL may be electrically connected to a driving voltage line PL and may receive a constant voltage. For example, the shielding layer SHL may receive the driving power voltage ELVDD from the driving voltage line PL. To this end, at least a portion of the driving voltage line PL may be electrically connected to the shielding layer SHL through a contact hole (hereinafter, referred to as a second contact hole CNT2) defined in the first organic insulating layer 117. Specifically, the driving voltage line PL may be connected to the fourth connection electrode 1640 through the second contact hole CNT2, and the fourth connection electrode 1640 may be connected to a portion of the shielding layer SHL through a contact hole defined in the second interlayer insulating layer 116 between the fourth connection electrode 1640 and the shielding layer SHL. For example, the portion of the shielding layer SHL may be the third portion SHL3 described above with reference to FIG. 12.

Because the shielding layer SHL is located between the connection line CL and the driving thin-film transistor T1 and receives a constant voltage, the parasitic capacitance and the coupling phenomenon between the connection line CL and the driving thin-film transistor T1 may be prevented. Accordingly, the deterioration of the display quality of the display panel 10 may be prevented.

Figure 17:
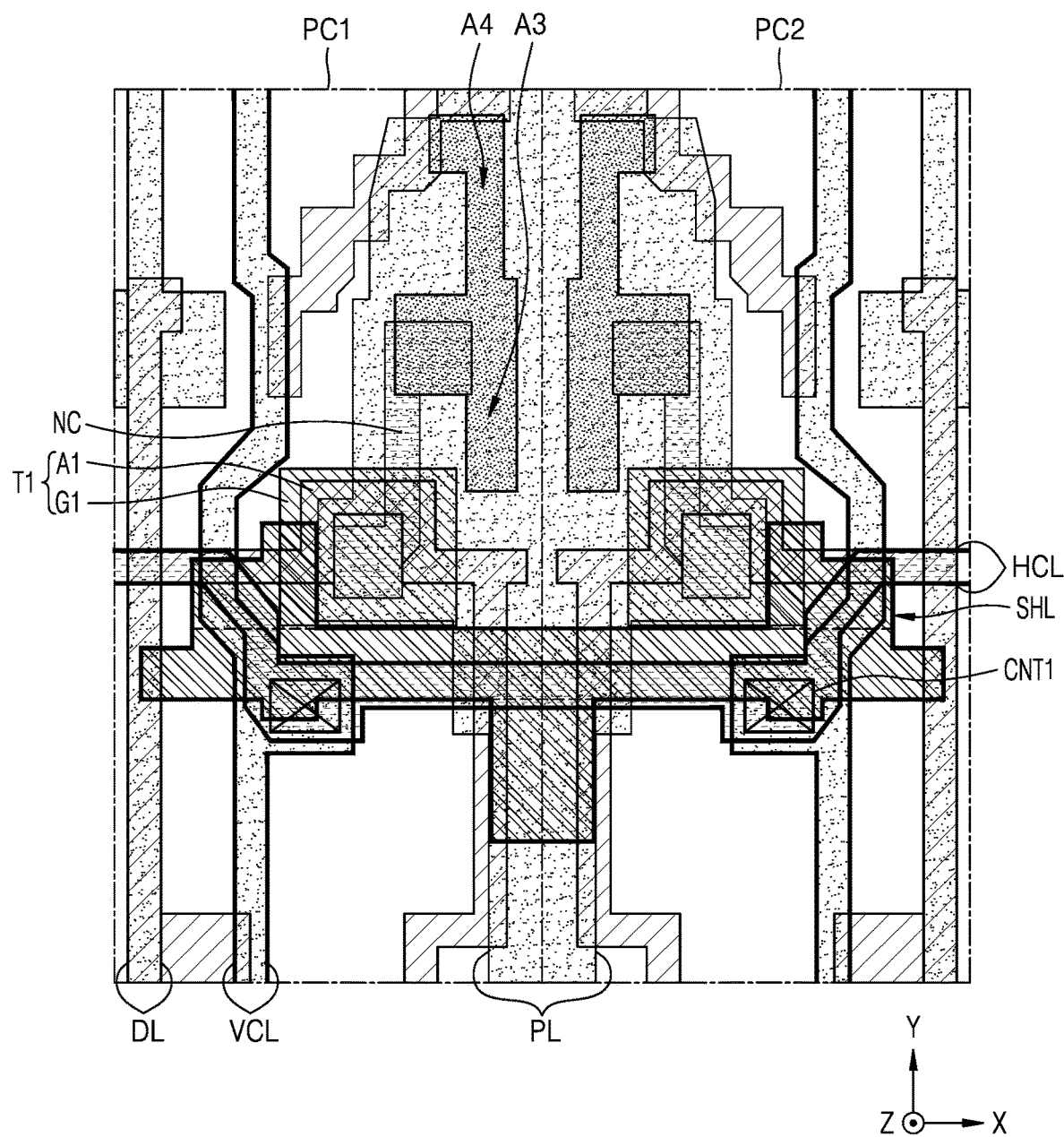
FIG. 17 is a schematic plan view illustrating some pattern layers constituting a pixel circuit of a display panel according to an embodiment.

FIG. 17 is a schematic plan view illustrating some pattern layers constituting a pixel circuit PC of a display panel 10 according to an embodiment.

FIG. 17 shows the first pattern layer 1100 (see FIG. 8), the driving gate electrode G1 of the second pattern layer 1200 (see FIG. 9), the fourth pattern layer 1400 (see FIG. 11), the shielding layer SHL of the fifth pattern layer 1500 (see FIG. 12), the node connection line NC and the horizontal connection line HCL of the sixth pattern layer 1600 (see FIG. 13), and the data line DL, the vertical connection line VCL, and the driving voltage line PL of the seventh pattern layer 1700 (see FIG. 14).

Referring to FIG. 17, the connection line CL may not overlap the fourth pattern layer 1400 in a plan view. For example, the horizontal connection line HCL and/or the vertical connection line VCL may not overlap the compensation semiconductor layer A3 and the first initialization semiconductor layer A4 in a plan view. That is, the connection line CL may not overlap thin-film transistors including the oxide semiconductor, for example, the compensation thin-film transistor T3 (see FIG. 7) and/or the first initialization thin-film transistor T4 (see FIG. 7) in a plan view. Accordingly, the influence (e.g., a coupling problem) of the connection line CL, which transmits a data signal, on the compensation thin-film transistor T3 and/or the first initialization thin-film transistor T4 may be effectively reduced.

In addition, as the connection lines CL do not overlap the compensation semiconductor layer A3 and/or the first initialization semiconductor layer A4 in a plan view, the degree of freedom in design regarding the arrangement of a semiconductor layer and gate electrodes constituting the compensation thin-film transistor T3 and/or the first initialization thin-film transistor T4 may increase.

As the connection lines CL are arranged so as not to overlap the compensation semiconductor layer A3 and the first initialization semiconductor layer A4 in a plan view, some of the connection lines CL may overlap the driving thin-film transistor T1 in a plan view.

According to an embodiment of the disclosure, a shielding layer SHL overlapping at least a portion of the connection line CL and at least a portion of the driving thin-film transistor T1 in a plan view may be provided. In an embodiment, the shielding layer SHL may be arranged at least in an area where the connection line CL and the driving thin-film transistor T1 overlap each other in a plan view. In some embodiments, the shielding layer SHL may overlap a portion of the horizontal connection line HCL and/or a portion of the vertical connection line VCL in a plan view. Accordingly, the shielding layer SHL may reduce a parasitic capacitance and coupling problem occurring between the connection line CL and the driving thin-film transistor T1.

Figure 18:
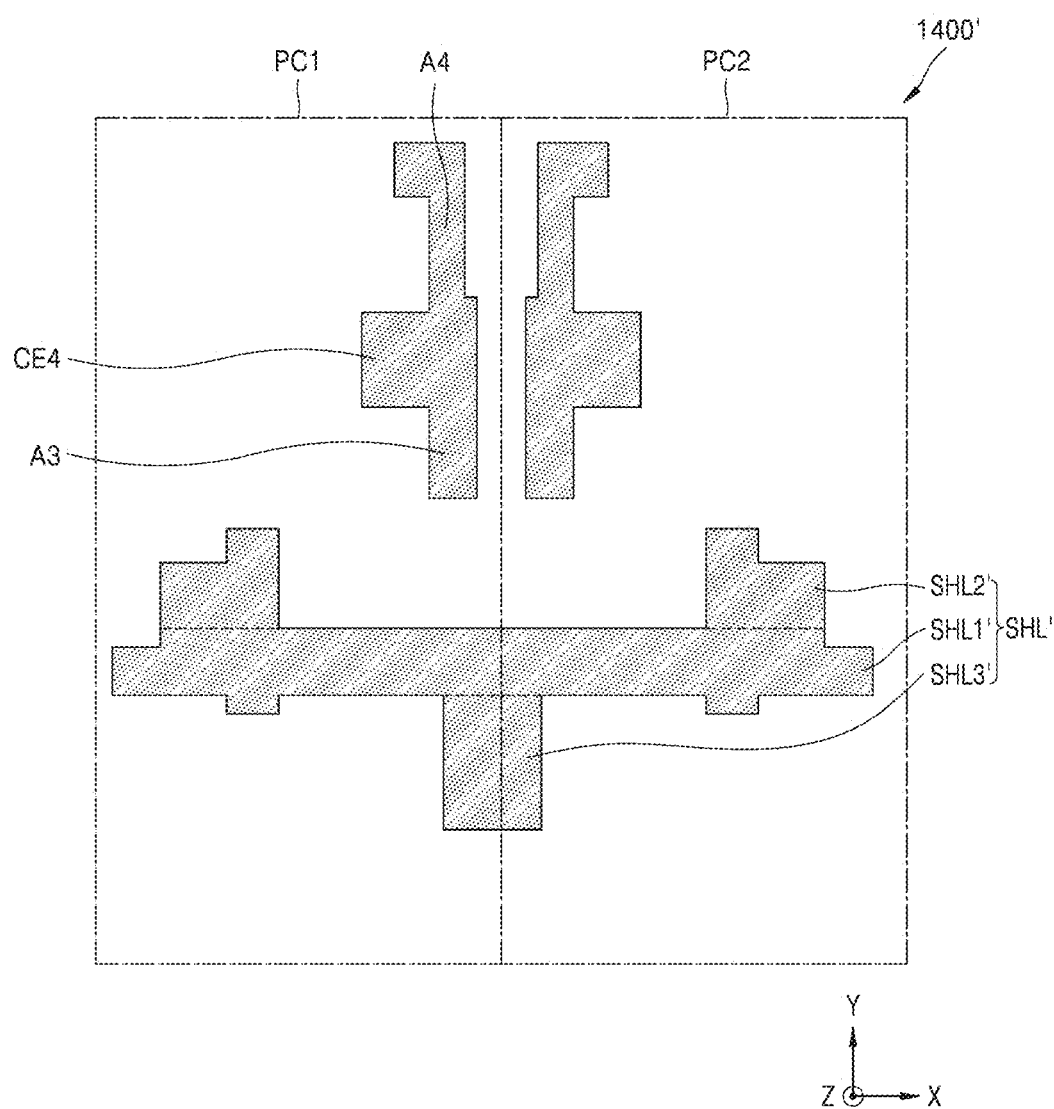
FIG. 18 is a schematic plan view illustrating some pattern layers constituting a pixel circuit of a display panel according to another embodiment.

FIG. 18 is a schematic plan view illustrating some pattern layers constituting a pixel circuit PC of a display panel 10 according to another embodiment. FIG. 18 is a plan view illustrating a fourth pattern layer 1400' and may be a modified embodiment of FIG. 11.

Referring to FIG. 18, the fourth pattern layer 1400' according to another embodiment may include a shielding layer SHL', and the shielding layer SHL' may include a first portion SHL1', a second portion SHL2' and a third portion SHL3' as described above with reference to FIG. 12. That is, the shielding layer SHL' may include the same material as the compensation semiconductor layer A3 and the first initialization semiconductor layer A4. In this case, the shielding layer SHL' may include an oxide semiconductor material.

Figure 19:
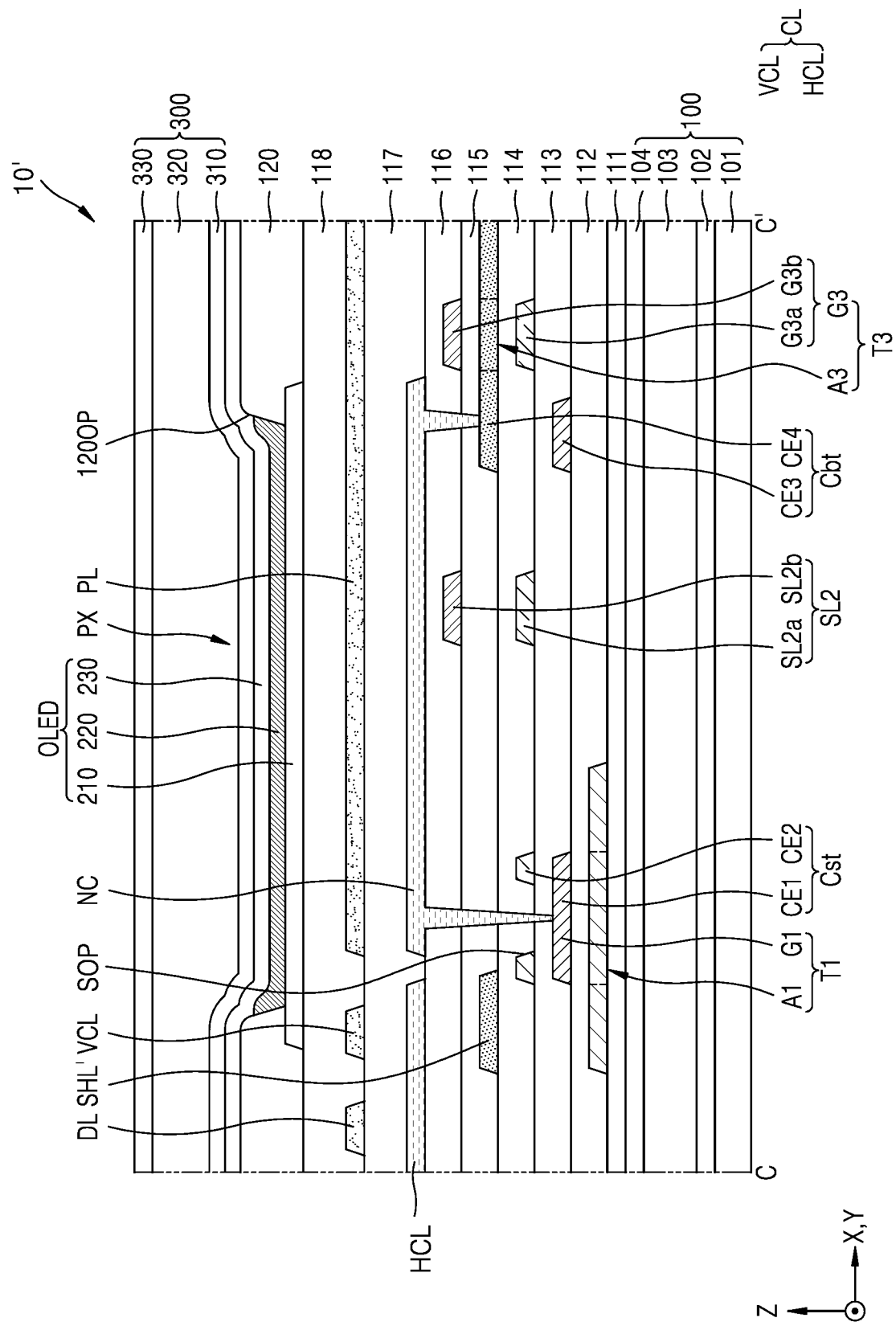
FIG. 19 is a schematic cross-sectional view of a portion of a display panel according to another embodiment.

FIG. 19 is a schematic cross-sectional view of a portion of a display panel 10' according to another embodiment. The cross-section of the display panel 10' of FIG. 19 may correspond to the cross-section of the display panel 10 of FIG. 15. FIG. 19 may be a modified embodiment of FIG. 15.

Referring to FIG. 19, a shielding layer SHL' according to another embodiment may be arranged in the same layer as the compensation semiconductor layer A3. Although not shown, the shielding layer SHL' may be arranged in the same layer as the first initialization semiconductor layer A4. The shielding layer SHL' may be between the first interlayer insulating layer 114 and the third gate insulating layer 115. Even in this case, the shielding layer SHL' may be electrically connected to the driving voltage line PL to receive a constant voltage from the driving voltage line PL.

Until now, only a display device has been mainly described, but the disclosure according to the invention is not limited thereto. For example, it will be understood that a method of manufacturing the display device is also within the scope of the disclosure.

According to embodiments of the disclosure given as described above, a display device having excellent characteristics such as low power consumption may be implemented by reducing a dead space in a peripheral area through a connection line and including some thin-film transistors including an oxide semiconductor material. In addition, by providing a shielding layer overlapping the connection line in a plan view, a display device with improved display quality may be implemented. Obviously, the scope of the disclosure according to the invention is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device including a display area and a peripheral area outside the display area, the display device comprising:
   a substrate;
   a first semiconductor layer located in the display area and arranged on the substrate;
   a second semiconductor layer arranged on the first semiconductor layer;
   a data line located in the display area and extending in a first direction;
   an input line located in the peripheral area;
   a connection line electrically connecting the data line and the input line to each other, the connection line including a vertical connection line extending in the first direction and a horizontal connection line extending in a second direction crossing the first direction, the horizontal connection line being arranged in a different layer from the vertical connection line, the vertical connection line including a same material as the data line; and
   a shielding layer located in the display area and located between the first semiconductor layer and the connection line in a cross-section view,
   the shielding layer overlapping at least a portion of the connection line in a plan view.

2. The display device of claim 1, wherein the connection line does not overlap the second semiconductor layer in the plan view.

3. The display device of claim 1, wherein the horizontal connection line of the connection line is spaced farther from the second semiconductor layer than the first semiconductor layer in the plan view.

4. The display device of claim 1, wherein the shielding layer includes:
   a first portion extending in the second direction to overlap at least a portion of the horizontal connection line of the connection line in the plan view; and
   a second portion extending in the first direction to overlap at least a portion of the vertical connection line of the connection line in the plan view.

5. The display device of claim 1, wherein the shielding layer does not overlap the second semiconductor layer in the plan view.

6. The display device of claim 1, further comprising:
   a first gate electrode, at least a portion of which overlaps the first semiconductor layer in the plan view; and
   a second gate electrode, at least a portion of which overlaps the second semiconductor layer in the plan view.

7. The display device of claim 6, wherein the shielding layer includes a same material as the second gate electrode.

8. The display device of claim 1, wherein the first semiconductor layer and the second semiconductor layer include different materials from each other.

9. The display device of claim 8, wherein the first semiconductor layer includes a silicon semiconductor material, and
   the second semiconductor layer includes an oxide semiconductor material.

10. The display device of claim 1, wherein the shielding layer includes a same material as the second semiconductor layer.

11. The display device of claim 1, further comprising a driving voltage line arranged on the substrate and extending in the first direction,
    wherein the shielding layer is electrically connected to the driving voltage line.

12. The display device of claim 1, further comprising:
    a first gate electrode, at least a portion of which overlaps the first semiconductor layer in the plan view;
    a second gate electrode, at least a portion of which overlaps the second semiconductor layer in the plan view; and
    a node connection line electrically connecting the first gate electrode to the second semiconductor layer,
    wherein the connection line includes a vertical connection line extending in the first direction, and a horizontal connection line extending in a second direction crossing the first direction, and
    the node connection line does not overlap the horizontal connection line of the connection line in the plan view.

13. The display device of claim 12, wherein the node connection line and the horizontal connection line of the connection line include a same material as each other.

14. A display device comprising:
    a substrate;
    a first semiconductor layer arranged on the substrate;
    a first gate electrode arranged on the first semiconductor layer and overlapping at least a portion of the first semiconductor layer in a plan view;
    a second semiconductor layer arranged on the first gate electrode and including a material different from a material of the first semiconductor layer;
    a second gate electrode arranged on the second semiconductor layer and overlapping at least a portion of the second semiconductor layer in the plan view;
    a horizontal connection line arranged on the second gate electrode and extending in a first direction;
    an organic insulating layer covering the horizontal connection line;
    a vertical connection line electrically connected to the horizontal connection line through a first contact hole defined in the organic insulating layer and extending in a second direction crossing the first direction; and
    a shielding layer between the first semiconductor layer and the horizontal connection line in a cross section view and overlapping at least a portion of the horizontal connection line and at least a portion of the vertical connection line in the plan view.

15. The display device of claim 14, wherein the horizontal connection line is spaced farther from the second semiconductor layer than the first semiconductor layer in the plan view.

16. The display device of claim 14, wherein the shielding layer is arranged in a same layer as the second gate electrode and includes a same material as the second gate electrode.

17. The display device of claim 14, wherein the shielding layer is arranged in a same layer as the second semiconductor layer and includes a same material as the second semiconductor layer.

18. The display device of claim 14, further comprising a data line and a driving voltage line each extending in the second direction and arranged in a same layer as the vertical connection line,
- wherein at least a portion of the driving voltage line is electrically connected to the shielding layer through a second contact hole defined in the organic insulating layer.

\* \* \* \* \*